(12) United States Patent
Murota et al.

(10) Patent No.: US 7,078,155 B2
(45) Date of Patent: Jul. 18, 2006

(54) PRESENSITIZED PLATE FOR MAKING LITHOGRAPHIC PRINTING PLATE

(75) Inventors: Yasubumi Murota, Haibara-gun (JP); Yoshinori Hotta, Haibara-gun (JP); Tadashi Endo, Haibara-gun (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 89 days.

(21) Appl. No.: 10/404,120

(22) Filed: Apr. 2, 2003

(65) Prior Publication Data

US 2003/0194648 A1    Oct. 16, 2003

(30) Foreign Application Priority Data

Apr. 2, 2002    (JP) .............................. 2002-099648

(51) Int. Cl.
| G03F 7/00 | (2006.01) |
| G03F 7/028 | (2006.01) |
| B41N 3/03 | (2006.01) |
| B41N 1/08 | (2006.01) |

(52) U.S. Cl. .................................................. 430/278.1
(58) Field of Classification Search .............. 430/278.1
See application file for complete search history.

(56) References Cited

U.S. PATENT DOCUMENTS

| 4,511,645 A * | 4/1985 | Koike et al. ............. 430/276.1 |
| 4,950,582 A * | 8/1990 | Aoai et al. ................... 430/175 |
| 5,925,498 A * | 7/1999 | DoMinh et al. ......... 430/278.1 |
| 6,103,087 A * | 8/2000 | Mori ........................... 205/214 |
| 2002/0018962 A1* | 2/2002 | Urano et al. ............. 430/273.1 |
| 2003/0165768 A1* | 9/2003 | Hotta et al. ................. 430/146 |

OTHER PUBLICATIONS

RN 114154-64-2, Registry File, ACS on STN, one page, copyright 2004.*
RN 215116-26-0 Regiustry File, ACS on STN, one page, copyright 2004.*

* cited by examiner

*Primary Examiner*—Cynthia Hamilton
(74) *Attorney, Agent, or Firm*—Sughrue Mion, PLLC

(57) ABSTRACT

A presensitized plate useful for making a lithographic printing plates comprises an aluminum substrate provided thereon with a photopolymerizable light-sensitive layer, wherein the light-sensitive layer comprises an ethylenically unsaturated bond-containing compound having at least three methacryloyl or acryloyl groups alone or in any combination in the molecule and the substrate is Substrate A, which has, on the surface, grained structures comprising medium waved structure whose average pore size ranges from 0.5. to 5 μm and small waved structure whose average pore size ranges from 0.01 to 0.2 μm, which are superimposed; or Substrate B, which has, on the surface, grained structures comprising large waved structure whose average wavelength ranges from 5 to 100 μm, medium waved structure whose average pore size ranges from 0.5 to 5 μm and small waved structure whose average pore size ranges from 0.01 to 0.2 μm, which are superimposed. The presensitized plate permits the maintenance of the balance between the resistance to contamination and the printing durability of the resulting lithographic printing plate to a substantially high level, when forming a light-sensitive layer containing a methacryl or acryl compound having at least three functional groups on the substrate according to the present invention having a characteristic surface grained pattern.

7 Claims, 2 Drawing Sheets

PRESENSITIZED PLATE FOR MAKING LITHOGRAPHIC PRINTING PLATE

BACKGROUND OF THE INVENTION

The present invention relates to a presensitized plate useful for making a lithographic printing plate, which comprises a specific substrate provided thereon with a photopolymerizable light-sensitive layer containing a specific ethylenically unsaturated bond-containing compound. More specifically, the present invention pertains to a presensitized plate useful for making a lithographic printing plate, which comprises a combination of a substrate having a specific surface structure with a photopolymerizable light-sensitive layer containing a specific ethylenically unsaturated bond-containing compound having a specific structure and which does not show any reduction of the sensitivity and can provide a printing plate capable of simultaneously satisfying the requirements such as the resistance to staining and printing durability.

The lithographic printing technique is a printing system, which makes the most use of the fact that the oil, in itself, is not miscible with water and thus the lithographic printing plate used in this printing technique carries, on the plate surface, a region, which receives water, but repels the oil-based ink (hereunder referred to as "non-image area") and a region, which repels water, but receives the oil-based ink (hereunder referred to as "image area") formed thereon.

The aluminum substrate used for making a lithographic printing plate (hereunder simply referred to as "substrate for lithographic printing plate") is used in such a manner that the surface thereof serves as non-image areas and therefore, it should have various reciprocal characteristic properties such as excellent hydrophilicity and water retention characteristics and excellent adhesion to the image-recording layer applied thereto.

If the hydrophilicity of the substrate is too low, ink is also adhered to the non-image area and this in turn results in the staining of the body of a blanket and in its turn the so-called scumming. Moreover, if the water retention of the substrate is too low, the clogging of shadowed portions is observed unless the amount of the dampening water is increased upon printing. For this reason, the so-called water tolerance becomes narrow.

To obtain a substrate for lithographic printing plate excellent in these characteristic properties, it is common to subject an aluminum plate to a surface-graining treatment (or a surface-roughening treatment) to thus impart unevenness to the surface. Regarding this unevenness, there have been proposed a variety of shapes as will be detailed below. Japanese Un-Examined Patent Publication (hereunder referred to as "J.P. KOKAI") Hei 8-300844 discloses a triple structure comprising large, medium and small waves in which the pore sizes of the medium and small waves are specified. J.P. KOKAI Nos. Hei 11-99758 and Hei 11-208138 disclose a double structure comprising large and small waves in which the diameter of the small waves is specified. J.P. KOKAI Hei 11-167207 discloses a technique for imparting fine projections to the surface of an aluminum plate in addition to large/small double concaved portions (pits). Japanese Patent No. 2,023,476 discloses a double structure in which the pore size is specified. J.P. KOKAI Hei 8-300843 discloses a double structure whose factor: a30 indicating the surface smoothness is specified. J.P. KOKAI Hei 10-35133 discloses a structure, which is formed by a plurality of electrochemical surface-roughening treatments (hereunder also referred to as "electrolytic surface-roughening treatment(s)") and in which the ratio of diameters of pits to be superposed.

In this surface-graining treatment, there have been used, for instance, mechanical surface-roughening methods such as ball graining, brush graining, wire graining and blast graining methods; electrolytic surface-roughening methods in which an aluminum plate was electrolytically etched in an electrolyte containing hydrochloric acid and/or nitric acid; and a composite surface-roughening method comprising a mechanical surface-roughening method and an electrolytic surface-roughening method.

In the foregoing conventional techniques, however, the resistance to staining and the printing durability are in the trade-off relationship and thus, the conventional techniques cannot simultaneously accomplish the foregoing two characteristic properties, or high resistance to staining and high printing durability.

SUMMARY OF THE INVENTION

Accordingly, it is an object of the present invention to solve the foregoing problems and more specifically to provide a presensitized plate useful for making a lithographic printing plate, which can provide a lithographic printing plate simultaneously showing excellent resistance to staining and high printing durability.

The inventors of this invention have conducted various studies to solve the foregoing problems, have variously investigated the size and combinations of uneven structures on the substrate surface used in the presensitized plate useful for making a lithographic printing plate and as a result, have found that when combining uneven structures having specific sizes, the balance between the resistance to staining and the printing durability can be maintained at a relatively high level. Moreover, the inventors have likewise investigated the light-sensitive layer, have found that the balance between the resistance to staining and the printing durability can be maintained at a quite high level by the use of a photopolymerizable light-sensitive layer comprising an ethylenically unsaturated bond-containing compound having at least three methacryloyl or acryloyl groups alone or in any combination thereof in the molecule and have thus completed the present invention.

According to the present invention, there is thus provided a presensitized plate useful for making a lithographic printing plate, which comprises an aluminum substrate provided thereon with a photopolymerizable light-sensitive layer, wherein the light-sensitive layer comprises an ethylenically unsaturated bond-containing compound having at least three methacryloyl groups or acryloyl groups alone or in any combination thereof in the molecule and the substrate is either the following substrate A or B:

Substrate A: A substrate having, on the surface, grained structures comprising medium waved structure whose average pore size ranges from 0.5 to 5 μm and small waved structure whose average pore size ranges from 0.01 to 0.2 μm, which are superimposed;

Substrate B: A substrate having, on the surface, grained structures comprising large waved structure whose average wavelength ranges from 5 to 100 μm, medium waved structure whose average pore size ranges from 0.5 to 5 μm and small waved structure whose average pore size ranges from 0.01 to 0.2 μm, which are superimposed.

Simultaneously, the inventors have also found that when the foregoing photopolymerizable light-sensitive layer further comprises an ethylenically unsaturated bond-containing compound carrying, in the molecule, one or two methacryloyl groups or acryloyl groups alone or in any combination thereof, the printing durability of the resulting lithographic printing plate is further improved.

DESCRIPTION OF THE PREFERRED EMBODIMENTS

Figure 1:
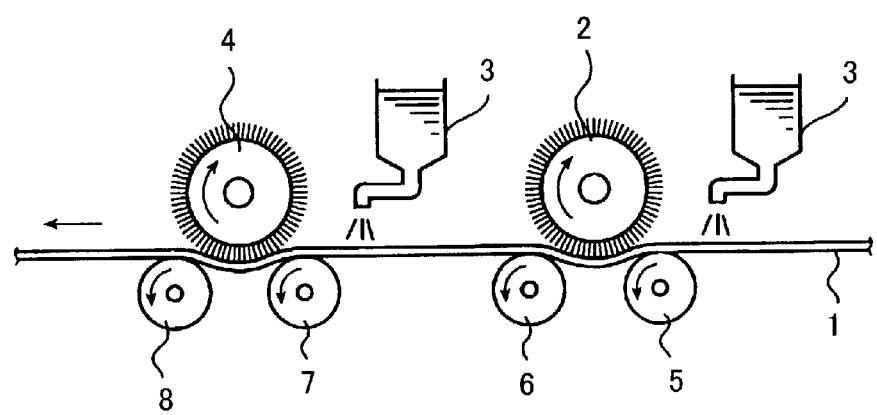
FIG. 1 is a side view of showing the concept of the brush graining process used in the mechanical surface graining treatment, in the production of the substrate for making a lithographic printing plate according to the present invention.

The presensitized plate useful for making a lithographic printing plate according to the present invention will be described in more detail below.

[Substrate for Lithographic Printing Plate]

<Grained Structure of Surface>

The substrate used in the presensitized plate useful for making a lithographic printing plate according to the present invention may be either the following substrate A or B:

Substrate A: A substrate having, on the surface, grained structures comprising medium waved structure whose average pore size ranges from 0.5 to 5 µm and small waved structure whose average pore size ranges from 0.01 to 0.2 µm, which are superimposed;

Substrate B: A substrate having, on the surface, grained structures comprising large waved structure whose average wavelength ranges from 5 to 100 µm, medium waved structure whose average pore size ranges from 0.5 to 5 µm and small waved structure whose average pore size ranges from 0.01 to 0.2 µm, which are superimposed.

In the substrates A and B, the medium waved structures whose average pore size ranges from 0.5 to 5 µm serves to support an image-recording layer mainly due to their anchor function and to impart printing durability to the resulting lithographic printing plate. If the average pore size of the pits present in such a medium waved structure is less than 0.5 µm, the adhesion to the image-recording layer applied onto the substrate as an upper layer is reduced and thus the printing durability of the resulting lithographic printing plate may often be impaired. While if it exceeds 5 µm, the number of pit-boundary portions, which have anchoring effects is reduced and accordingly, the printing durability of the resulting lithographic printing plate may likewise be reduced.

The small waved structures whose average pore size ranges from 0.01 to 0.2 µm, which are superimposed upon the foregoing medium waved structures, mainly serves to improve the resistance to staining of the resulting lithographic printing plate. The combination of these medium and small waved structures would permit the formation of a uniform water film on the surface of a lithographic printing plate and, in its turn, the combination can likewise prevent the generation of any staining of the non-image area, when dampening water is supplied to the printing plate during printing operations. If the average pore size of the pits present in such a small waved structure is less than 0.01 µm, the small waved structure is often insufficient for achieving the desired effect of water film-formation. While if it exceeds 0.2 µm, the medium waved structure is destroyed and therefore, one cannot often enjoy the foregoing effect of improving the printing durability due to the presence of the medium waved structure.

The depth of pits present in the small waved structure can be controlled in addition to the pore size thereof to thus further improve the resistance to staining of the resulting lithographic printing plate. In other words, the average ratio of the depth to the pore size of the small waved structure is preferably adjusted to a level of not less than 0.2. Thus, a uniform water film may certainly be formed on the surface of the resulting lithographic printing plate and accordingly, good resistance to surface staining of the non-image area would be maintained over a long period of time.

Moreover, the substrate B has a grained structure comprising the foregoing structure, which comprises superimposed medium waved and small waved structures on which a large waved structure having an average wavelength ranging from 5 to 100 µm is superposed.

The large waved structure has an effect of increasing the amount of water retained on the surface of the non-image area of a lithographic printing plate. The greater the amount of water retained on the surface, the smaller the influence of contaminants present in the atmosphere on the surface of the non-image area and accordingly, the resulting non-image area is hardly stained even when the printing plate is allowed to stand in the course of printing operations. In addition, if a large waved structure is superimposed, it becomes easy to visually confirm the amount of the dampening water applied to the plate surface during printing operations. In other words, the resulting printing plate has excellent plate-examining characteristics. If the average wavelength of the large waved structure is less than 5 µm, the surface often loses the difference between the large and medium waved structures. On the other hand, if it exceeds 100 µm, the non-image area exposed after the imagewise exposure and development may be too glare and the plate-examining characteristics thereof may sometimes be impaired. The average wavelength of the large waved structure preferably ranges from 10 to 80 µm.

Regarding the substrate used in the presensitized plate useful for lithographic printing plate according to the present invention, the average pore size of the medium waved structure, that of the small waved structure and the average ratio of the depth to the pore size as well as the average wavelength of the large waved structure can be determined according to the methods specified below.

(1) Determination of the Average Pore Size of the Medium Waved Structure

The average pore size of the medium waved structure is determined by taking a photograph of the surface of a substrate to be examined in the direction just above the same using an electron microscope of 2000 magnification, selecting at least 50 pits having the medium waved structure (medium waved pits), the peripheries of which are connected with each other like a ring, among the pits present in the electron micrograph and reading the diameter thereof as the pore diameter. In case of the surface structure in which a large waved structure is superimposed, the average pore size is determined by the same method.

Moreover, to eliminate any scattering of the measurement, the diameter of an equivalent circle can be determined using a commercially available image analysis software. In this case, the diameter of an equivalent circle is calculated by reading images on the foregoing electron micrograph using a scanner to digitize them and then subjecting the digitized images to binarization.

The inventors of this invention determined the average pore size according to the visual method and the digital image processing and found that these methods provided results almost identical to one another. The same results were also obtained in case of the surface structure in which a large waved structure is superimposed.

(2) Determination of the Average Pore Size of the Small Waved Structure

The average pore size can be calculated by taking a photograph of the surface of a substrate to be examined from the direction just above the surface using a high resolution scanning electron microscope (SEM) of 50000 magnification, selecting at least 50 pits having the medium waved structure (small waved pits) among the pits present in the electron micrograph and reading the diameter thereof as the pore diameter.

(3) Determination of the Average Ratio of the Depth to the Pore Size of the Small Waved Structure This average ratio of the depth to the pore size can be calculated by taking a photograph of a fractured section of a substrate to be examined using a high resolution SEM of 50000 magnification, selecting at least 20 small waved pits among the pits present in the electron micrograph, reading the pore diameter and depth thereof and calculating the ratio and then averaging the same.

(4) Determination of the Average Wavelength of the Large Waved Structure

The two-dimensional surface roughness is determined using a tracer type surface roughness tester and the average peak-to-peak distance Sm specified in IOS4287 is determined for 5 times to calculate the average thereof, which is defined to be the average wavelength.

<Surface Treatment>

The substrate used in the presensitized plate useful for lithographic printing plate according to the present invention is an aluminum plate on which the foregoing surface grained pattern or structure is formed by subjecting an aluminum plate, as will be detailed later, to a surface treatment. Such a surface treatment may be a surface-roughening treatment and an anodization treatment, but the processes for preparing the substrate are not restricted to specific ones and the surface treatment may include a variety of other processes other than these surface-roughening treatments and anodization treatments.

Examples of representative methods for forming the foregoing surface grained pattern or structure are as follows, but the present invention is not restricted to these specific examples at all:

A method comprising the step of subjecting an aluminum plate to a mechanical surface-roughening treatment, an alkali-etching treatment, a desmutting treatment with an acid and an electrochemical surface-roughening treatment using an electrolyte in this order;

A method comprising the step of subjecting an aluminum plate to a mechanical surface-roughening treatment, an alkali-etching treatment, a desmutting treatment with an acid and an electrochemical surface-roughening treatment repeated a plurality of times using different electrolytes;

A method comprising the step of subjecting an aluminum plate to an alkali-etching treatment, a desmutting treatment with an acid and an electrochemical surface-roughening treatment using an electrolyte in this order; and A method comprising the step of subjecting an aluminum plate to an alkali-etching treatment, a desmutting treatment with an acid and an electrochemical surface-roughening treatment repeated a plurality of times using different electrolytes.

In these methods, the aluminum plate may further be subjected to an alkali-etching treatment and a desmutting treatment with an acid after the electrochemical surface-roughening treatment.

The substrate used in the presensitized plate useful for lithographic printing plate of the present invention, which is prepared by the foregoing method carries a pattern or structure comprising uneven structures having at least two different periods and formed on the surface thereof, as has been described above. Therefore, the substrate permits the preparation of a lithographic printing plate excellent in both the resistance to staining and the printing durability.

Each of the foregoing surface treatments will now be described below in more detail.

<Mechanical Surface-Roughening Treatment>

The mechanical surface-roughening treatment permits the formation of a surface having uneven structure having an average wavelength ranging from 5 to 100 μm at a low cost when comparing with the electrochemical surface-roughening treatment and therefore, this technique is effective as a means for roughening the surface of a substrate.

Specific examples of such mechanical surface-roughening treatments are a wire brush graining method in which the surface of an aluminum plate is scratched with a metal wire; a ball graining method comprising the step of graining the aluminum plate surface with abrasive balls and an abrasive; and a brush graining methods as disclosed in J.P. KOKAI Hei 6-135175 and Japanese Examined Patent Publication (hereunder referred to as "J.P. KOKOKU") Sho 50-40047 in which the aluminum plate surface is grained with a nylon brush and an abrasive.

It is also possible to use a transfer method in which a plane carrying uneven patterns is pressed against an aluminum plate. Specific examples thereof include transfer methods disclosed in J.P. KOKAI Nos. Sho 55-74898, Sho 60-36195 and Sho 60-203496; a method disclosed in J.P. KOKAI Hei 6-55871 in which the transfer operation is repeated several times; and a method disclosed in Japanese Patent Application Hei 4-204235 (J.P. KOKAI Hei 6-024168), which is characterized in that the surface is elastic.

Moreover, examples of mechanical surface-roughening treatments usable herein further include a method in which a desired pattern is repeatedly transferred using a transfer roll on which fine uneven patterns are etched by electro-erosion, shot blast, laser and/or plasma-etching; a method comprising the steps of bringing a plane whose surface has been roughened by applying fine particles into contact with an aluminum plate and repeatedly applying a pressure to the resulting assembly over a plurality of times to thus repeatedly transfer the uneven pattern corresponding to the average particle size of the fine particles to the aluminum plate over a plurality of times. In this respect, examples of methods for forming uneven patterns on transfer rolls include known ones disclosed in, for instance, J.P. KOKAI Nos. Hei 3-8635, Hei 3-66404 and Sho 63-65017. Further, fine grooves are cut on the roll surface in two directions using, for instance, die, bite or laser beams to thus form square-shaped (or angular) uneven pattern on the surface. The roll surface may be treated by, for instance, a known etching treatment to thus make the square-shaped uneven pattern round.

In addition, the roll may likewise be subjected to tempering and/or hard chromium-plating treatments to thus increase the hardness of the surface thereof.

Moreover, examples of mechanical surface-roughening treatments usable in the present invention include those disclosed in, for instance, J.P. KOKAI Nos. Sho 61-162351 and Sho 63-104889, in addition to the foregoing examples.

In the present invention, the methods listed above can be used in combination while taking into consideration, for instance, productivity. These mechanical surface-roughening treatments are preferably carried out prior to the electrochemical surface-roughening treatment.

The brush graining method will hereunder be described in detail below, which is suitably used as a mechanical surface-roughening treatment.

The brush graining method is in general carried out by rubbing one or both surfaces of the foregoing aluminum plate with rotating roll-shaped brush while injecting a slurry containing an abrasive onto the surface, wherein the roll-shaped brush comprises a cylindrical body and a large number of fillings of, for instance, nylon (registered trademark), propylene resins and vinyl chloride resins implanted in the cylindrical body. Alternatively, a grinding roll having an abrasive layer on the surface is substituted for the foregoing roll-shaped brush and slurry.

When using a roll-shaped brush, it preferably comprises fillings having a bending modulus ranging from 10,000 to 40,000 kg/cm$^2$ and more preferably 15,000 to 35,000 kg/cm$^2$ and a nerve of preferably not more than 500 g and more preferably not more than 400 g. The diameter of the fillings in general ranges from 0.2 to 0.9 mm. The length of the fillings may appropriately be determined depending on the outer diameter of the roll-shaped brush and the diameter of the body thereof, but it generally ranges from 10 to 100 mm.

As abrasives, any known one can be used in the present invention. Specific examples thereof are pumice stone, silica sand, aluminum hydroxide, alumina powder, silicon carbide, silicon nitride, volcanic ash, carborundum, powder emery and mixture thereof. Among them, preferred are pumice stone and silica sand. In particular, the silica sand is hard and hardly broken as compared with the pumice stone and therefore, the former is preferred because of its excellent surface-roughening efficiency.

The average particle size of the abrasive preferably ranges from 5 to 50 μm and more preferably 6 to 45 μm since the abrasives having such a particle size are excellent in the surface-roughening efficiency and they permit the reduction of the graining pitch.

The abrasive is, for instance, suspended in water to give a slurry prior to the practical use. Such a slurry may comprise a thickening agent, a dispersant (such as a surfactant) and a preservative, in addition to an abrasive. The specific gravity of the slurry preferably ranges from 0.5 to 2.

Devices suitably used in the mechanical surface-roughening treatment may be, for instance, those disclosed in J.P. KOKOKU Sho 50-40047.

<Electrochemical Surface-Roughening Treatment>

In the electrochemical surface-roughening treatment, there may be used, for instance, electrolytes currently used in the electrochemical surface-roughening treatment using an alternating current. Among them, the use of an electrolyte mainly comprising hydrochloric acid or nitric acid would permit the formation of uneven structures peculiar to the present invention.

The electrolytic surface-roughening treatment used in the invention preferably comprises first and second electrolyzation treatments in an acidic solution using an alternating waved current, which are conducted before and/or after the cathodic electrolyzation treatments. Hydrogen gas is generated on the aluminum plate surface due to the cathodic electrolyzation, smut is thus formed and the surface condition is accordingly uniformized. This in turn permits the uniform electrolytic surface-roughening treatment of the plate in the subsequent electrolyzation treatment using an alternating waved current.

This electrolytic surface-roughening treatment may be conducted according to the electrochemical graining method (electrolytic graining method) disclosed in J.P. KOKOKU Sho 48-28123 and G.B. Patent No. 896,563. This electrochemical graining method makes use of a sinusoidal waved alternating current, but it is also possible to use a current having a specific waveform as disclosed in J.P. KOKAI Sho 52-58602. Further, it is also possible to use a current having a waveform as disclosed in J.P. KOKAI Hei 3-79799. In addition, examples of methods usable herein also include those disclosed in J.P. KOKAI Nos. Sho 55-158298, Sho 56-28898, Sho 52-58602, Sho 52-152302, Sho 54-85802, Sho 60-190392, Sho 58-120531, Sho 63-176187, Hei 1-5889, Hei 1-280590, Hei 1-118489, Hei 1-148592, Hei 1-178496, Hei 1-188315, Hei 1-154797, Hei 2-235794, Hei 3-260100, Hei 3-253600, Hei 4-72079, Hei 4-72098, Hei 3-267400 and Hei 1-141094. In addition to the foregoing methods, the electrolyzation can be conducted using an alternating current having a specific frequency proposed in the method for preparing an electrolytic condenser. Such an alternating current is disclosed in, for instance, U.S. Pat. Nos. 4,276,129 and 4,676,879.

Moreover, there have been proposed a variety of electrolytic cells and power sources, but usable herein include those disclosed in, for instance, U.S. Pat. No. 4,203,637 and J.P. KOKAI Nos. Sho 56-123400, Sho 57-59770, Sho 53-12738, Sho 53-32821, Sho 53-32822, Sho 53-32823, Sho 55-122896, Sho 55-132884, Sho 62-127500, Hei 1-52100, Hei 1-52098, Sho 60-67700, Hei 1-230800 and Hei 3-257199.

Also usable herein include those disclosed in, for instance, J.P. KOKAI Nos. Sho 52-58602, Sho 52-152302, Sho 53-12738, Sho 53-12739, Sho 53-32821, Sho 53-32822, Sho 53-32833, Sho 53-32824, Sho 53-32825, Sho 54-85802, Sho 55-122896, Sho 55-132884, Sho 52-133838, Sho 52-133840, Sho 52-133844, Sho 52-133845, Sho 53-149135 and Sho 54-146234 and J.P. KOKOKU Nos. Sho 48-28123 and Sho 51-7081.

The acidic solution as the electrolyte may be those disclosed in, for instance, U.S. Pat. Nos. 4,671,859, 4,661, 219, 4,618,405, 4,600,482, 4,566,960, 4,566,958, 4,566,959, 4,416,972, 4,374,710, 4,336,113 and 4,184,932.

The concentration of the acidic solution preferably ranges from 0.5 to 2.5% by mass and particularly preferably 0.7 to 2.0% by mass while taking into consideration the use of the solution in the foregoing removal of the smut. In addition the temperature of the solution preferably ranges from 20 to 80° C. and more preferably 30 to 60° C.

The aqueous solution mainly containing hydrochloric acid or nitric acid may be used in the form of a 1 to 100 g/L aqueous solution of hydrochloric acid or nitric acid to which at least one nitrate ion-containing nitrate compound such as aluminum nitrate, sodium nitrate and ammonium nitrate or chloride ion-containing compound derived from hydrochloric acid such as aluminum chloride, sodium chloride and ammonium chloride, in an amount ranging from 1 g/L to saturation. Moreover, the aqueous solution mainly containing hydrochloric acid or nitric acid may comprise, in dissolved conditions, metals included in aluminum alloys such as iron, copper, manganese, nickel, titanium, magnesium and silicon. In the present invention, it is preferred to use a 0.5 to 2% by mass hydrochloric acid or nitric acid aqueous solution to which an aluminum compound such as aluminum chloride or aluminum nitrate is added in such an amount that the aluminum ion concentration falls within the range of from 3 to 50 g/L.

Moreover, the use of such an aqueous solution to which a compound capable of forming a complex with Cu is added would permit the uniform surface graining of aluminum plates having a high Cu content. Examples of compounds capable of forming complexes with Cu include ammonia; amines obtained by replacing the hydrogen atoms of ammonia with hydrocarbon groups (such as aliphatic and aromatic hydrocarbon groups) such as methylamine, ethylamine, dimethylamine, diethylamine, trimethyl-amine, cyclohexylamine, triethanolamine, tri-isopropanolamine and EDTA (ethylene-diaminetetraacetic acid); and metal carbonates such as sodium carbonate, potassium carbonate and potassium bicarbonate. Examples thereof usable herein also include ammonium salts such as ammonium nitrate, ammonium chloride, ammonium sulfate, ammonium phosphate and ammonium carbonate.

The temperature used in the electrochemical surface-roughening treatment preferably ranges from 10 to 60° C. and more preferably 20 to 50° C.

The waveforms of alternating power supplies used in the electrochemical surface-roughening treatment are not particularly restricted, those usable herein include, for instance, sinusoidal waves, rectangular waves, trapezoidal waves and triangular waves, preferably rectangular waves and trapezoidal waves, with trapezoidal waves being particularly preferred. The trapezoidal wave means that shown in FIG. 2. As such trapezoidal waves, preferred are waves in which the time (TP) required for reaching the peak current from zero current ranges from 1 to 3 msec. If the time (TP) is less than 1 msec, uneven processing or so-called chattering marks are easily generated, which are generated in the direction perpendicular to the traveling direction of the aluminum plate, while if the TP value exceeds 3 msec, the surface-roughening treatment is quite susceptible to trace components in the electrolyte represented by, for instance, ammonium ions, which are spontaneously increased in the electrolyzation treatment, in particular, when using a nitric acid-containing electrolyte and it is difficult to uniformly grain the aluminum plate surface. As a result, there is such a tendency that the resistance to staining of the resulting lithographic printing plate is reduced.

The duty ratio of the trapezoidal waved alternating current usable herein ranges from 1:2 to 2:1 and it is preferred to use trapezoidal waved alternating currents having a duty ratio of 1:1 in the indirect power supply system in which any conductor roll for aluminum is not used, as disclosed in J.P. KOKAI Hei 5-195300.

The frequency of the trapezoidal waved alternating current usable herein ranges from 0.1 to 120 Hz and preferably 50 to 70 Hz from the viewpoint of the installation used. If the frequency is less than 50 Hz, the carbon electrode as a principal electrode is easily dissolved in the electrolyte, while if it exceeds 70 Hz, the treatment is quite susceptible to the inductance component on the power supply circuit and this leads to an increase of the power supply cost.

Figure 3:
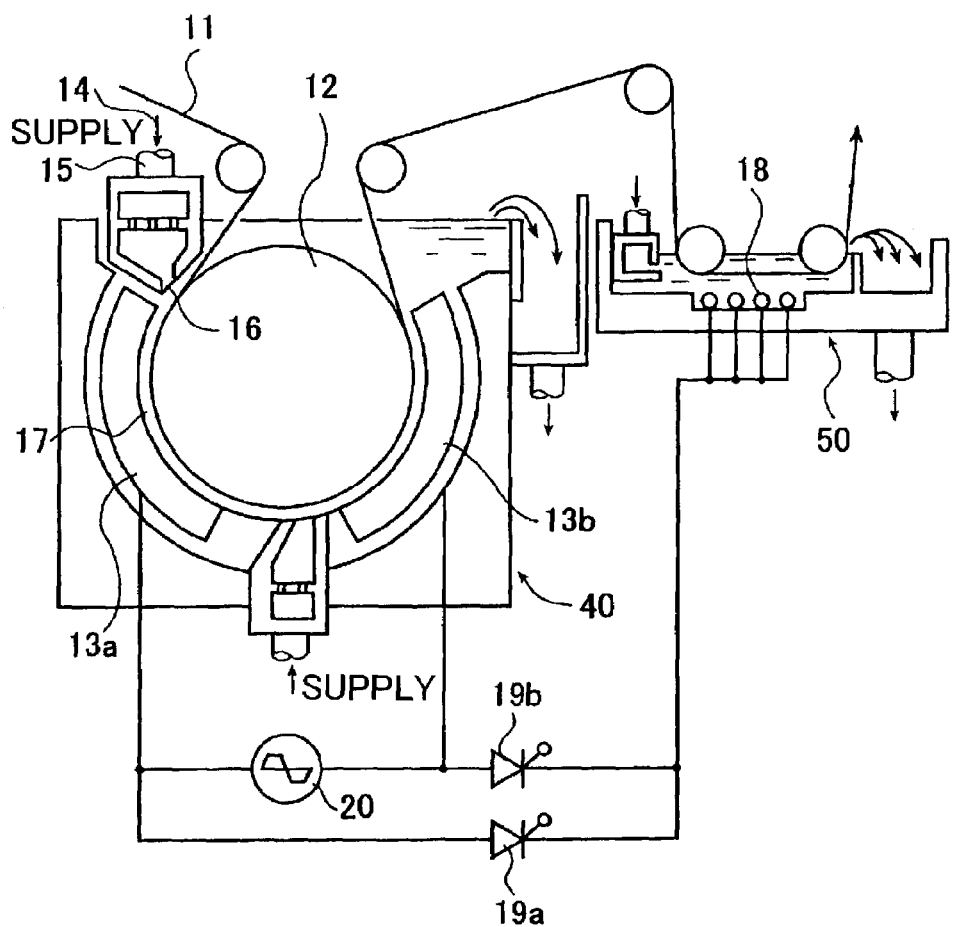
FIG. 3 is a side view showing an example of the radial type cell used in the electrochemical surface roughening treatment, which makes use of an alternating current, in the production of the substrate for making a lithographic printing plate according to the present invention.

The electrolytic cell may be connected to one or more alternating power supplies. As shown in FIG. 3, it is preferred to dispose an auxiliary anode so that a part of the alternating current is branched in order to achieve uniform surface graining by controlling the ratio between the alternating anode and cathode currents supplied to the aluminum plate opposite to the principal electrode and to dissolve the carbon principal electrode. In FIG. 3, reference numeral 11 represents an aluminum plate, 12 a radial drum roll, 13a and 13b principal electrodes, 14 a liquid for the electrolyzation treatment, 15 a supply port for an electrolyte, 16 a slit, 17 a passage for the electrolyte, 18 an auxiliary anode, 19a and 19b thyristors, 20 an alternating power supply, 40 a main electrolytic cell and 50 an auxiliary anode cell. The ratio of the current value involved in the anode reaction to the current value involved in the cathode reaction on the aluminum plate opposed to the principal electrode can be controlled by branching a part of the current value to an auxiliary electrode, which is disposed in another cell separated from the two principal electrodes, as a direct current through a rectifying element or a switching element. The ratio of the quantities of electricity involved in the anode and cathode reactions (the quantity of cathode time electricity/the quantity of anode time electricity) preferably falls within the range of from 0.3 to 0.95.

The electrolytic cells usable herein may be those used in the known surface treatments such as vertical type, flat type and radial type ones, with the radial type electrolytic cells as disclosed in J.P. KOKAI Hei 5-195300 being particularly preferred. The electrolyte passing through the electrolytic dell may be a parallel or countercurrent flow with respect to the traveling direction of the aluminum web.

(Nitric Acid Electrolyzation)

Pits having an average pore size ranging from 0.5 to 5 μm may be formed by the electrochemical surface-roughening treatment using an electrolyte mainly comprising nitric acid. In this respect, however, when using a relatively high quantity of electricity, the electrolytic reaction may focus on specific points to thus form honeycomb pits whose pore size exceeds 5 μm.

To obtain such a grained pattern, the total quantity of electricity involved in the anode reaction on the aluminum plate at the end of the electrolytic reaction preferably ranges from 1 to 1000 C/dm$^2$ and more preferably 50 to 300 C/dm$^2$. At this stage, the current density preferably ranges from 20 to 100 A/dm$^2$.

Moreover, it is also possible to form small waved structures whose average pore size is not more than 0.2 μm through the use of a nitric acid-containing electrolyte having a high concentration or a high temperature.

(Hydrochloric Acid Electrolyzation)

Hydrochloric acid in itself has a high aluminum-solubilizing ability and therefore, a fine uneven pattern can be formed on the aluminum plate surface simply by electrolyzing the plate to slight extent. This fine uneven pattern has a pore size ranging from 0.01 to 0.2 μm and the pattern is formed on the entire surface of the aluminum plate uniformly. To obtain such a grained pattern, the total quantity of electricity involved in the anode reaction on the aluminum plate at the end of the electrolytic reaction preferably ranges from 1 to 100 C/dm$^2$ and more preferably 20 to 70 C/dm$^2$. At this stage, the current density preferably ranges from 20 to 50 A/dm$^2$.

Large crater-like undulations may simultaneously be formed on an aluminum plate by increasing the total quantity of electricity involved in the anode reaction to the range of from 400 to 1000 C/dm$^2$ in the electrochemical surface-roughening treatment using an electrolyte mainly comprising hydrochloric acid, but in this case, fine uneven structures having an average pore size ranging from 0.01 to 0.4 µm are formed on the entire surface of the aluminum plate and they are superimposed on crater-like undulations having an average pore size ranging from 10 to 30 µm. For this reason, medium waved structures having an average pore size ranging from 0.5 to 5 µm cannot be superimposed thereon in this case and accordingly, any grain pattern peculiar to the present invention cannot be formed.

The aluminum plate is preferably subjected to a cathodic electrolyzation treatment between the foregoing first and second electrolytic surface-roughening treatments conducted in an electrolyte mainly comprising, for instance, hydrochloric acid or nitric acid. As a result of this cathodic electrolyzation treatment, smut is formed on the aluminum plate surface, hydrogen gas is simultaneously generated and this in turn makes the electrolytic surface-roughening treatment more uniform. This cathodic electrolyzation treatment is carried out in an acidic solution at a quantity of cathode time electricity preferably ranging from 3 to 80 C/dm$^2$ and more preferably 5 to 30 C/dm$^2$. This is because if the quantity of cathode time electricity is less than 3 C/dm$^2$, the amount of adhered smut is sometimes insufficient, while if it exceeds 80 C/dm$^2$, the amount of adhered smut is sometimes too high. Moreover, the electrolyte may be identical to or different from the solution used in the foregoing first and second electrolytic surface-roughening treatments.

<Alkali Etching Treatment>

This alkali etching treatment is a treatment for dissolving the superficial layer of the foregoing aluminum plate by bringing the plate into contact with an alkali solution.

The alkali etching treatment carried out prior to the electrolytic surface-roughening treatment is used for the removal of, for instance, the rolling oil, contaminants and a spontaneously formed oxide film on the foregoing aluminum plate (rolled aluminum plate) when the aluminum plate is free of any mechanical surface-roughening treatment and the etching treatment is carried out for dissolving the edges of the uneven patterns formed through a mechanical surface-roughening treatment and for converting sharp uneven patterns into smooth undulations when the plate has been mechanically surface-roughened.

If any mechanical surface-roughening treatment is not conducted prior to the alkali etching treatment, the amount of aluminum removed by the etching preferably ranges from 0.1 to 10 g/m$^2$ and more preferably 1 to 5 g/m$^2$. This is because if the etched amount is less than 0.1 g/m$^2$, the rolling oil, contaminants, spontaneously formed oxide film or the like often remain on the surface and therefore, any uniform pit cannot be formed in the subsequent electrolytic surface-roughening treatment or the aluminum plate surface would not uniformly be electrolytically surface-roughened. On the other hand, if the etched amount falls within the range of from 1 to 10 g/m$^2$, undesirable substances such as rolling oil, contaminants, spontaneously formed oxide film can completely be removed from the surface of the aluminum plate. On the other hand, the alkali etching carried out in an amount beyond the range specified above is unfavorable from the viewpoint of the production cost.

If a mechanical surface-roughening treatment is carried out prior to an alkali etching treatment, the amount of aluminum removed by the etching preferably ranges from 3 to 20 g/m$^2$ and more preferably 5 to 15 g/m$^2$. This is because if the etched amount is less than 3 g/m$^2$, it is often impossible to smoothen the uneven patterns formed through, for instance, a mechanical surface-roughening treatment and any uniform pit cannot be formed in the subsequent electrolytic surface-roughening treatment. Moreover, the resulting printing plate is sometimes deteriorated in its resistance to staining during printing operations. On the other hand, if it exceeds 20 g/m$^2$, the uneven structures formed may often disappear from the plate surface.

The alkali etching treatment conducted immediately after the electrolytic surface-roughening treatment is carried out for the purpose of the dissolution of the smut formed in the acidic electrolyte and the edges of pits formed through the electrolytic surface-roughening treatment.

The pits formed through the electrolytic surface-roughening treatment differ from one another and in its turn, the optimum amounts of aluminum removed by the etching likewise vary depending on the kinds of electrolytes used, but the amounts of aluminum removed by the etching carried out after the electrolytic surface-roughening treatment preferably ranges from 0.1 to 5 g/m$^2$. The etched amount for the electrolytic surface-roughening treatment conducted using a nitric acid-containing electrolyte should be set at a level higher than that for the treatment conducted using a hydrochloric acid-containing electrolyte.

When such an electrolytic surface-roughening treatment is repeatedly carried out over a plurality of times, an alkali etching treatment may be carried out after each surface-roughening treatment.

Alkalis included in alkali solutions used for the etching treatment may be, for instance, caustic alkalis and alkali metal salts. Specific examples of caustic alkalis are caustic soda and caustic potash. In addition, examples of alkali metal salts are alkali metal silicates such as sodium metasilicate, sodium silicate, potassium metasilicate and potassium silicate; alkali metal carbonates such as sodium carbonate and potassium carbonate; alkali metal aluminates such as sodium aluminate and potassium aluminate; aldonic acid salts of alkali metals such as sodium gluconate and potassium gluconate; and alkali metal hydrogen phosphates such as sodium secondary phosphate, potassium secondary phosphate, sodium tertiary phosphate and potassium tertiary phosphate. Among these, preferably used herein are solutions of caustic alkalis and solutions containing both caustic alkalis and alkali metal aluminates, since they can etch the aluminum plate at a high etching rate and they are not expensive. An aqueous solution of caustic soda is particularly preferred.

The concentration of the alkali solution can be determined depending on the amount of aluminum to be removed through the etching, but preferably ranges from 1 to 50% by mass and more preferably 10 to 35% by mass. In case where aluminum ions are present in the alkali solution, the aluminum ion concentration preferably ranges from 0.01 to 10% by mass and more preferably 3 to 8% by mass. The temperature of the alkali solution preferably ranges from 20 to 90° C. The time required for the treatment preferably ranges from 1 to 120 seconds.

Examples of methods for bringing an aluminum plate into contact with an alkali solution include a method in which an aluminum plate is passed through a bath filled with such an alkali solution; a method comprising the step of immersing an aluminum plate in a bath filled with such an alkali solution; and a method comprising the step of spraying such an alkali solution on an aluminum plate.

<Desmutting Treatment>

A washing treatment with an acid (acid-washing or desmutting treatment) is carried out for the removal of stains (smut) remaining on the surface of the aluminum plate after the electrolytic surface-roughening treatment or the alkali etching treatment. Acids used in this treatment may be, for instance, nitric acid, sulfuric acid, phosphoric acid, chromic acid, hydrofluoric acid and hydroborofluoric acid.

The foregoing desmutting treatment is, for instance, carried out by bringing the foregoing aluminum plate into contact with an acidic solution containing, for instance, hydrochloric acid, nitric acid or sulfuric acid in a concentration ranging from 0.5 to 30% by mass (having an aluminum ion content ranging from 0.01 to 5% by mass). Examples of methods for bringing an aluminum plate into contact with an acidic solution include a method in which an aluminum plate is passed through a bath filled with such an acidic solution; a method comprising the step of immersing an aluminum plate in a bath filled with such an acidic solution; and a method comprising the step of spraying such an acidic solution on an aluminum plate.

In this desmutting treatment, the foregoing acidic solution usable herein may be the waste liquor of the aqueous solution mainly comprising nitric acid or hydrochloric acid discharged from the foregoing electrolytic surface-roughening treatment, or the waste liquor of the aqueous solution mainly comprising sulfuric acid discharged from the anodization treatment as will be described later.

The temperature of the liquid used in the desmutting treatment preferably ranges from 25 to 90° C. In addition, the time required for the treatment preferably ranges from 1 to 180 seconds. The acidic solution used in the desmutting treatment may comprise aluminum and aluminum alloy components dissolved therein.

<Anodization Treatment>

The aluminum plate subjected to the foregoing treatments is further subjected to an anodization treatment. Such an anodization treatment may be carried out according to methods currently used in this field. In this case, an anodized layer may, for instance, be formed by passing an electric current through the aluminum plate serving as an anode in a solution containing 50 to 300 g/L of sulfuric acid and not more than 5% by mass of aluminum. Examples of solutions used in the anodization treatment are sulfuric acid, phosphoric acid, chromic acid, oxalic acid, sulfamic acid, benzenesulfonic acid and amidosulfonic acid, which may be used alone or in any combination of at least two of them.

In the anodization treatment, the electrolyte used may comprise components commonly included in at least aluminum plate, electrodes, tap water and underground water. Moreover, the electrolyte may further comprise second and third components. The terms "second components" and "third components" herein used mean, for instance, metal ions such as Na, K, Mg, Li, Ca, Ti, Al, V, Cr, Mn, Fe, Co, Ni, Cu and Zn ions; cations such as ammonium ions; and anions such as nitrate ions, carbonate ions, chloride ions, phosphate ions, fluoride ions, sulfite ions, titanate ions, silicate ions and borate ions, which may be included in a concentration ranging from 0 to about 10000 ppm.

The conditions for the anodization treatment cannot unconditionally be determined since they variously vary depending on the electrolyte used, but the anodization treatment is in general and suitably carried out under the following conditions: an electrolyte concentration ranging from 1 to 80% by mass; a temperature of the electrolyte ranging from 5 to 70° C.; a current density ranging from 0.5 to 60 A/dm$^2$; an electric voltage ranging from 1 to 100 V; and an electrolyzation time of 15 seconds to 50 minutes. These anodization conditions are appropriately adjusted so as to form a desired amount of anodized layer.

In addition, it is also possible to used method disclosed in, for instance, J.P. KOKAI Nos. Sho 54-81133, Sho 57-47894, Sho 57-51289, Sho 57-51290, Sho 57-54300, Sho 57-136596, Sho 58-107498, Sho 60-200256, Sho 62-136596, Sho 63-176494, Hei 4-176897, Hei 4-280997, Hei 6-207299, Hei 5-24377, Hei 5-32083, Hei 5-125597 and Hei 5-195291.

Among these methods, preferably used herein are those, which make use of sulfuric acid solutions are used as electrolytes as disclosed in J.P. KOKAI Nos. Sho 54-12853 and Sho 48-45303. The sulfuric acid concentration in the electrolyte preferably ranges from 10 to 300 g/L (1 to 30% by mass) and the aluminum ion concentration of the electrolyte preferably ranges from 1 to 25 g/L (0.1 to 2.5% by mass) and more preferably 2 to 10 g/L (0.2 to 1% by mass). Such an electrolyte can be prepared by, for instance, adding aluminum sulfate or the like to a diluted sulfuric acid having a sulfuric acid concentration ranging from 50 to 200 g/L.

When the anodization treatment is carried out in a sulfuric acid-containing electrolyte, a direct or alternating current may be applied between an aluminum plate and the counter electrode.

When a direct current is applied to the aluminum plate, the current density used ranges from 1 to 60 A/dm$^2$ and more preferably 5 to 40 A/dm$^2$.

When the anodization treatment is continuously carried out, it is preferred that a current is passed through the aluminum plate at a low current density ranging from 5 to 10 A/dm$^2$ in the early stage of the anodization treatment and then the current density is increased to the range of from 30 to 50 A/dm$^2$ or higher as the anodization treatment proceeds.

When the anodization treatment is continuously carried out, the treatment is preferably conducted according to the liquid electric power supply system in which an electric power is supplied to the aluminum plate through an electrolyte.

The anodization treatment carried out under such conditions permits the formation of a porous film having a large number of holes called pores (micropores). In this respect, the average pore size of these holes is in general on the order of about 5 to 50 nm and the average pore density of the porous film is on the order of 300 to 800 pores/$\mu$m$^2$.

The amount of the anodized layer formed preferably ranges from 1 to 5 g/m$^2$. This is because if the amount of the anodized layer is less than 1 g/m$^2$, the resulting presensitized plate is liable to be damaged, while if it exceeds 5 g/m$^2$, a large quantity of electric power is required for the production of an aluminum plate carrying anodized layer and this accordingly leads to an increase in the production cost. The amount of the anodized layer more preferably ranges from 1.5 to 4 g/m$^2$. Moreover, the anodization treatment is preferably carried out in such a manner that the difference in the amount of the anodized layer between the central portion and portions in the proximity to the edge of the aluminum plate is equal to not more than 1 g/m$^2$.

Electrolyzation devices used in the anodization treatment may be, for instance, those disclosed in, for instance, J.P. KOKAI Nos. Sho 48-26638 and Sho 47-18739 and J.P. KOKOKU Sho 58-24517.

Figure 4:
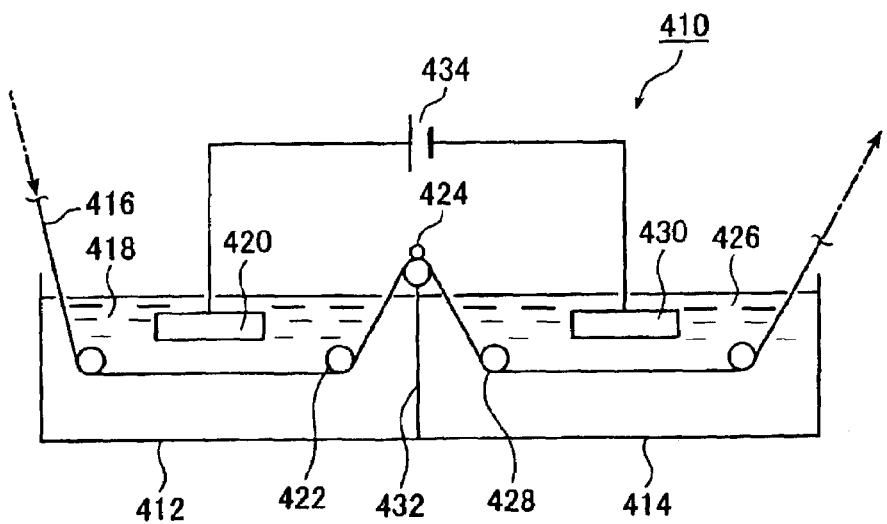
FIG. 4 is a schematic diagram showing an anodization device used in the anodization treatment, in the production of the substrate for making a lithographic printing plate according to the present invention.

Among them, suitably used herein is a device as shown in FIG. 4. FIG. 4 is a schematic diagram showing an embodiment of the device for anodizing the surface of an aluminum plate. In this device 410 for anodization treatment, an aluminum plate 416 is conveyed along the line indicated by an arrow shown in FIG. 4. In an electric power supply tank 412 in which an electrolyte 418 is stored, the aluminum plate 416 is positively (+) charged by the action of an electric power supply electrode 420. Then the aluminum plate 416 is upward conveyed by the action of a roll 422 within the electric power supply tank 412, the conveying direction of the plate is downward changed by the action of nip rolls 424, thereafter the plate is conveyed towards a tank 414 for the electrolyzation treatment in which an electrolyte 426 is stored and then the conveying direction of the plate is changed to the horizontal direction by the action of a roll 428. Then the aluminum plate 416 is negatively (−) charged by an electrolyzation electrode 430 so that an anodized layer is formed on the surface of the plate and the aluminum plate 416 coming out of the tank 414 for the electrolyzation treatment is conveyed towards the subsequent step. In the foregoing device 410 for anodization treatment, the roll 422, nip rolls 424 and roll 428 constitute a means for changing the conveying direction of the aluminum plate and thus the aluminum plate 416 is conveyed along a cone-shaped and inverted U-shaped lines between the power supply tank 412 and the tank 414 for electrolyzation. The electric power supply electrode 420 and the electrolyzation electrode 430 are electrically connected to a direct current power source 434.

The anodization device 410 shown in FIG. 4 is characterized in that the electric power supply tank 412 and the tank 414 for electrolyzation are separated by a tank wall 432 and that the aluminum plate 416 is conveyed along cone-shaped and inverted U-shaped lines between these tanks. Thus, the length of the aluminum plate 416 between the tanks can be minimized. For this reason, the whole length of the device 410 for anodization can be reduced and this in turn permits the considerable reduction of the cost of equipment. Moreover, the requirement for the formation of an opening, on the walls of the tanks 412 and 414, through which the aluminum plate 416 can be conveyed, by transporting the plate 416 along the foregoing cone-shaped and inverted U-shaped lines. Accordingly, the amount of the liquid to be supplied for maintaining the liquid level to a desired height in the tanks 412 and 414 can be saved and therefore, the operation cost can be reduced <Sealing Treatment>

In the present invention, the aluminum plate may, if needed, be subjected to a sealing treatment for sealing micropores present in the anodized layer. The sealing treatment can be conducted according to any known method such as the treatments with boiling water, hot water, steam, sodium silicate, nitrites or ammonium acetate. For instance, the aluminum plate can be subjected to the sealing treatment using a device and a method as disclosed in, for instance, J.P. KOKOKU Sho 56-12518, J.P. KOKAI Hei 4-4194 and Japanese Patent Appln. Nos. Hei 4-33952 (J.P. KOKAI Hei 5-202496) and Hei 4-33951 (J.P. KOKAI Hei 5-33951).

<Hydrophilization Treatment>

After the anodization treatment or the sealing treatment, the aluminum plate may be subjected to a hydrophilization treatment. Examples of such hydrophilization treatments are the treatment with potassium fluorozirconate disclosed in U.S. Pat. No. 2,946,638; the treatment with phosphomolybdate disclosed in U.S. Pat. No. 3,201,247; the treatment with an alkyl titanate disclosed in G.B. Patent No. 1,108,559; the treatment with a polyacrylate disclosed in German Patent No. 1,091,433; the treatments with polyvinyl sulfonates disclosed in German Patent No. 1,134,093 and G.B. Patent No. 1,230,447; the treatment with phosphonic acid disclosed in J.P. KOKOKU Sho 44-6409; the treatment with phytic acid disclosed in U.S. Pat. No. 3,307,951; the treatment with a bivalent metal salt of hydrophilic organic high molecular weight compound disclosed in J.P. KOKAI Nos. Sho 58-16893 and Sho 58-18291; the treatment in which an under coating layer (intermediate layer) of a hydrophilic cellulose (such as carboxymethyl cellulose) containing a water-soluble metal salt (such as zinc acetate) disclosed in U.S. Pat. No. 3,860,426; and the treatment for applying an under coating layer of a sulfo group-containing water-soluble polymer (a treatment for the application of an intermediate layer) disclosed in J.P KOKAI Sho 59-101651.

Examples of such hydrophilization treatments usable herein also include treatments for applying under coating layers (treatments for the application of intermediate layers) of, for instance, a phosphoric acid salt disclosed in J.P. KOKAI Sho 62-019494; a water-soluble epoxy compound disclosed in J.P. KOKAI Sho 62-033692; a phosphoric acid-modified starch disclosed in J.P. KOKAI Sho 62-097892; a diamine compound disclosed in J.P. KOKAI Sho 63-056498; an inorganic or organic acid of an amino acid disclosed in J.P. KOKAI Sho 63-130391; an organic phosphonic acid containing a carboxyl or hydroxyl group disclosed in J.P. KOKAI Sho 63-145092; a compound containing amino and phosphonate groups disclosed in J.P. KOKAI Sho 63-165183; a specific carboxylic acid derivative disclosed in J.P. KOKAI Hei 2-316290; a phosphoric acid ester disclosed in J.P. KOKAI Hei 3-215095; a compound having one amino group and one phosphorus-oxy acid group disclosed in J.P. KOKAI Hei 3-261592; a phosphoric acid ester disclosed in J.P. KOKAI Hei 3-215095; an aliphatic or aromatic sulfonic acid such as phenyl phosphonic acid disclosed in J.P. KOKAI Hei 5-246171; an S atom-containing compound such as thio-salicylic acid disclosed in J.P. KOKAI Hei 1-307745; and a compound having a phosphorus-oxy acid group disclosed in J.P. KOKAI Hei 4-282637.

The aluminum plate may further be pigmented with an acid dye disclosed in J.P. KOKAI Sho 60-64352.

In addition, it is also preferred to carry out such a hydrophilization treatment according to a method comprising the step of immersing an aluminum plate in an aqueous solution of an alkali metal silicate such as sodium silicate or potassium silicate or a method comprising the step of applying a hydrophilic vinyl polymer or a hydrophilic compound to thus form an under coating layer (an intermediate layer).

The hydrophilization treatment with an aqueous solution of an alkali metal silicate such as sodium silicate or potassium silicate can be conducted according to the method and procedures disclosed in U.S. Pat. Nos. 2,714,066 and 3,181,461.

Examples of alkali metal silicates are sodium silicate, potassium silicate and lithium silicate. The aqueous alkali metal silicate solution may comprise a proper amount of an alkali such as sodium hydroxide, potassium hydroxide or lithium hydroxide.

Moreover, the aqueous alkali metal silicate solution may likewise contain an alkaline earth metal salt or a salt of $4^{th}$ Group (Group IVA) metal. Examples of such alkaline earth metal salts are nitrates such as calcium nitrate, strontium nitrate, magnesium nitrate and barium nitrate; sulfuric acid salts; hydrochloric acid salts; phosphoric acid salts; acetic acid salts; oxalic acid salts; and boric acid salts. Examples of salts of 4$^{th}$ Group (Group IVA) metals are titanium tetrachloride, titanium trichloride, potassium titanium fluoride, potassium titanium oxalate, titanium sulfate, titanium tetra-iodide, zirconium oxychloride, zirconium dioxide, zirconium oxychloride and zirconium tetrachloride. These alkaline earth metal salts and salts of 4$^{th}$ Group (Group IVA) metals may be used alone or in any combination of two or more of them.

The amount of Si adsorbed on the aluminum plate through the treatment with an alkali metal silicate can be determined using a fluorescent X-ray analyzer and the adsorbed amount thereof preferably ranges from about 1.0 to 15.0 mg/m$^2$.

This treatment with an alkali metal silicate also permits the improvement of the resistance to solubilization of the surface (of the substrate for lithographic printing plate) with a developer. This accordingly inhibits the dissolution of aluminum component into the developer and this in turn permits the reduction of the generation of any development scum due to the fatigue of the developer.

Alternatively, the hydrophilization treatment by the formation of a hydrophilic under coating layer (intermediate layer) may be carried out in accordance with the conditions and procedures disclosed in J.P. KOKAI Nos. Sho 59-101651 and Sho 60-149491.

Examples of hydrophilic vinyl polymers used in this method are polyvinyl sulfonic acids and copolymers of sulfo group-containing vinyl polymerizable compounds such as sulfo group-containing p-styrene-sulfonic acid with the usual vinyl polymerizable compounds such as alkyl esters of (meth)acrylic acids. In addition, hydrophilic compounds usable in this method may be, for instance, compounds carrying at least one member selected from the group consisting of —NH$_2$ groups, —COOH groups and sulfo groups.

<Water-Washing Treatment>

After the completion of each treating process described above, the aluminum plate is preferably washed with water. In the water-washing step, there may be used, for instance, pure water, well water and tap water. A nip roll device may be used for the prevention of any carrying over of the processing solution to the subsequent step.

<Aluminum Plate (Rolled Aluminum Plate)>

Any known aluminum plate may be used for obtaining a substrate used in the presensitized plate for making a lithographic printing plate according to the present invention. The aluminum plate used in the present invention is a dimensionally stable metal plate comprising aluminum as a main component and may be aluminum or aluminum alloy plates. Examples of such aluminum plates are pure aluminum plates and aluminum alloy plates containing aluminum as a principal component and a trace amount of foreign elements.

In the specification, a variety of substrates comprising aluminum or aluminum alloys described above are generically referred to as "aluminum plate". Examples of the foregoing foreign elements, which may be present in the aluminum alloys, are silicon, iron, manganese, copper, magnesium, chromium, zinc, bismuth, nickel and titanium and the content of these foreign elements in the aluminum alloy is not more than 10% by mass on the basis of the total mass of the alloy.

As has been discussed above, the aluminum plate used in the present invention is not limited in its composition and may be appropriately selected from conventionally known materials as disclosed in "Aluminum Handbook", 4$^{th}$ edition (1990, issued by the Light Metal Society), for instance, Al—Mn type aluminum plates such as JIS A1050, JIS A1100, JIS A1070, Mn-containing JIS A3004 and Internationally Registered Alloy 3103A. It is also possible to use these aluminum alloy plates to which magnesium is incorporated in an amount of not less than 0.1% by mass for the improvement of the tensile strength of the plate, such as Al—Mg alloy and Al—Mn—Mg alloy (JIS A3005) plates. In addition, usable herein also include Al—Zr alloy and Al—Si alloy plates containing Zr and/or Si as well as Al—Mg—Si alloy plates.

In the present invention it is also possible to use aluminum plates such as those listed above, whose surface is made uneven in the final rolling step according to, for instance, the lamination rolling or transfer technique.

The aluminum plate used in the present invention is a continuous belt-like sheet material or a plate-like material. In other wards, the plate may be an aluminum web or a flat paper-like sheet cut into pieces having a size corresponding to the presensitized plate for lithographic printing plate distributed as a commercial good.

Cracks or scratched marks on the surface of an aluminum plate may serve as defects when the plate is processed into a substrate for lithographic printing plate and therefore, the occurrence of any defect should be controlled to an extent as low as possible at the stage prior to the surface treatment for preparing the substrate for lithographic printing plate. To this end, the aluminum plates are preferably in a stable shape and in a type of packing, which is hardly damaged during transportation.

In case of an aluminum web, the types of packing thereof are, for instance, ones in which a hard board and a felt are laid on a pallet of iron, doughnut-like plates of corrugated board are placed on the both ends of a product, the entire of the assembly is wrapped with a polymer tube, a wooden doughnuts are inserted into the interior of the resulting coil, felts are applied to the outer peripheral portions, the coil is fastened with a hoop iron and indications are displayed thereon. Moreover, a polyethylene film may be used as a packaging material and needle felt and hard board may be used as buffering materials. There have been known a variety of other packaging methods in addition to the foregoing and therefore, the types of packing are not restricted to particular ones inasmuch as they permit, for instance, stable transportation of aluminum webs without damaging the same.

The thickness of the aluminum plate used in the present invention is on the order of 0.1 mm to 0.6 mm, preferably 0.15 mm to 0.4 mm and more preferably 0.2 to 0.3 mm. The thickness thereof may properly be changed depending on a variety of factors such as the size of a printing press used, the size of a printing plate to be prepared and user's requests.

The presensitized plate useful for making a lithographic printing plates according to the present invention is prepared by forming, in order, an intermediate layer described above or as will be detailed below and a photopolymerizable light-sensitive layer on an aluminum plate which has been subjected to surface treatments as has been described above.

[Intermediate Layer]

The presensitized plate useful for making a lithographic printing plates according to the present invention may comprise an intermediate layer between the photopolymerizable light-sensitive layer and the substrate, containing additives for improving the adhesion between them and the substrate and the ability of removing the un-exposed portions on the light-sensitive layer through development. Examples of such intermediate layers are those listed below, in addition to that explained above. For instance, the adhesion between the light-sensitive layer and the substrate and the printing durability of the resulting printing plate can be improved by the addition of a compound having a relatively high interaction with the substrate such as a compound carrying a diazonium structure or a phosphonate compound or an under coat layer containing the same. On the other hand, the developing ability and the resistance to staining of the non-image area can be improved by the addition of a hydrophilic polymer such as a polyacrylic acid or a polysulfonic acid or an under coat layer containing the same.

[Photopolymerizable Light-Sensitive Layer]

The photopolymerizable light-sensitive layer used in the present invention is characterized in that it comprises an ethylenically unsaturated bond-containing compound having at least three methacryloyl groups or acryloyl groups alone or in any combination thereof in the molecule and if the light-sensitive layer satisfies the foregoing requirement, any conventionally known photopolymerizable light-sensitive layer can be used without any restriction.

Examples of commonly used photopolymerizable light-sensitive layer of the present invention are those comprising a photopolymerizable light-sensitive composition (hereunder referred to as "photopolymerizable composition") containing, as essential components, a photopolymerization initiator and a polymer binder in addition to the ethylenically unsaturated bond-containing compound. The light-sensitive layer may, if needed, simultaneously comprise various kinds of other compounds such as a coloring agent, a plasticizer and a heat polymerization inhibitor.

The construction of the photopolymerizable light-sensitive layer will hereunder be described in more detail.

<Ethylenically Unsaturated Bond-Containing Compound>

The light-sensitive layer of the presensitized plate useful for making a lithographic printing plates according to the present invention comprises, as an essential component, an ethylenically unsaturated bond-containing compound having at least three methacryloyl groups or acryloyl groups alone or in any combination thereof in the molecule.

The ethylenically unsaturated bond-containing compound herein means a compound having an ethylenically unsaturated bond capable of undergoing addition polymerization to thus cause or generate cross-linked structure and/or hardening when the photopolymerizable composition is irradiated with actinic rays. Examples of such compounds having an ethylenically unsaturated bond are those in chemical forms such as monomers and pre-polymers or dimmers, trimers and oligomers or mixture thereof and copolymers thereof, having at least one, preferably at least two terminal ethylenically unsaturated bonds.

The terms "methacryloyl group" and "acryloyl group" used herein mean groups represented by the formula: $CH_2=CHR—CO—$ (wherein R represents a hydrogen atom or a methyl group).

It is a matter of course that these ethylenically unsaturated bond-containing compounds may be synthesized by those skilled in the art on the basis of the knowledge in this field depending on each particular purpose. For instance, such compounds may appropriately be synthesized through the reaction of a compound having at least three functional groups such as hydroxyl and/or amino groups capable of forming ester bonds and/or amide bonds with the carboxyl groups of acrylic and/or methacrylic acids with a plurality of compound each having at least one such group and acrylic and/or methacrylic acids.

Specific examples thereof are trimethylolpropane triacrylate, trimethylolpropane tri(acryloyloxy-propyl)ether, trimethylolethane triacrylate, pentaerythritol triacrylate, pentaerythritol tetra-acrylate, dipentaerythritol diacrylate, dipentaerythritol penta-acrylate, dipentaerythritol hexa-acrylate, sorbitol triacrylate, sorbitol tetra-acrylate, sorbitol penta-acrylate, sorbitol hexa-acrylate, tri(acryloyloxy-ethyl) isocyanurate, trimethylolpropane tri-methacrylate, trimethylolethane tri-methacrylate, penta-erythritol tri-methacrylate, pentaerythritol tetra-methacrylate, dipentaerythritol di-methacrylate, dipentaerythritol hexa-methacrylate, dipentaerythritol penta-methacrylate, sorbitol tri-methacrylate, sorbitol tetra-methacrylate and diethylene-triamine tris-acrylamide. In addition, examples also include those disclosed in, for instance, Japanese Patent Appln. 2001-208108.

In a preferred embodiment of the present invention, the light-sensitive layer simultaneously comprises an ethylenically unsaturated bond-containing compound having at least three methacryloyl groups or acryloyl groups alone or in any combination in the molecule (at least three functional group-containing (meth)acrylate compound) and an at most two functional group-containing (meth)acrylate compound having at most two methacryloyl groups or acryloyl groups alone or in any combination in the molecule. The latter compound may likewise be prepared by a method similar to that used for preparing the former compound.

The mixing ratio of these compounds may appropriately be determined depending on each particular system, but preferably the ratio: (at least three functional group-containing (meth)acrylate compound)/(at most two functional group-containing (meth)acrylate compound) preferably ranges from 4 to 0.25, more preferably 2.5 to 0.4 and further preferably 1.5 to 0.6.

<Photopolymerization Initiator>

The photopolymerization initiator usable in the photopolymerizable light-sensitive layer in the presensitized plate useful for making a lithographic printing plates according to the present invention can be selected from a variety of photopolymerization initiators reported in many patents and literature or various combinations of two or more photopolymerization initiators (photoinitiator system), depending on the wavelength of the light source to be used. Specific examples thereof will be described below, but not limited thereto. There have been proposed various photoinitiator systems, which can be used for visible light rays having 400 nm or longer, Ar laser, secondary harmonics of semiconductor lasers, or SHG-YAG laser as a light source. For instance, a certain dye capable of being photolytically reduced such as Rose Bengale, Eosine, and Erythrosine (U.S. Pat. No. 2,850,445); a combination system of a dye and an initiator such as a combined initiator system comprising a dye and an amine (J.P. KOKOKU Sho 44-20189); a system comprising hexaaryl-biimidazole, a radical generator and a dye (J.P. KOKOKU Sho 45-37377); a system comprising a hexaaryl-biimidazole and a p-dialkylamino-benzylidene ketone (J.P. KOKOKU Sho 47-2528 and J.P. KOKAI Sho 54-155292); a system comprising a cyclic cis-☐-dicarbonyl compound and a dye (J.P. KOKAI Sho 48-84183); a system comprising a cyclic triazine and a merocyanine dye (J.P. KOKAI Sho 54-15102); a system comprising a 3-keto-coumarin and an activator (J.P. KOKAI Nos. Sho 52-112681 and Sho 58-15503); a system comprising bi-imidazole, a styrene derivative and thiol (J.P. KOKAI Sho 59-140203); a system comprising an organic peroxide and a pigment (J.P. KOKAI Nos. Sho 59-1504, Sho 59-140203, Sho 59-189340, Sho 62-174203, J.P. KOKOKU Sho 62-1641, U.S. Pat. No. 4,766,055); a system comprising a dye and an active halogen atom-containing compound (disclosed in, for instance, J.P. KOKAI Nos. Sho 63-258903 and Hei 2-63054); a system comprising a dye and a borate compound (disclosed in, for instance, J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348, Hei 1-138204); a system comprising a dye having a rhodanine ring and a radical generator (J.P. KOKAI Nos. Hei 2-179643 and Hei 2-244050); a system comprising a titanocene and 3-ketocoumarin dye (J.P. KOKAI Sho 63-221110); a system comprising titanocene, xanthene dye and an addition polymerizable compound having an ethylenically unsaturated bond and an amino group or a urethane group (J.P. KOKAI Nos. Hei 4-221958 and Hei 4-219756); a system comprising a titanocene and a specific merocyanine dye (J.P. KOKAI Hei 6-295061); and a system comprising a titanocene and a dye having a benzopyran ring (J.P. KOKAI Hei 8-334897).

In addition, a laser having a wavelength ranging from 400 nm to 410 nm (violet laser) has been developed and a photoinitiator system sensitive to the laser and highly sensitive to the light having a wavelength of 450 nm or shorter has also been developed. Therefore, such a photoinitiator system may likewise be used herein. Examples thereof include a system comprising a cationic dye/borate (J.P. KOKAI No. Hei 11-84647), a system comprising a merocyanine dye/titanocene (J.P. KOKAI 2000-147763), a system comprising a carbazole dye/titanocene (Japanese Patent Appln. Hei 11-221480). In particular, a system comprising a titanocene compound is preferably used in the present invention because of its high sensitivity.

Moreover, it is known that the photoinitiator activity of the foregoing photopolymerization initiator can be improved by the optional addition, to the initiator, of a hydrogen-donating compound, for instance, thiol compounds such as 2-mercapto-benzothiazole, 2-mercaptobenzimidazole and 2-mercaptobenzoxazole; and amine compounds such as N-phenyl-glycine and aromatic alkyl esters of N,N-dialkylamino-arylcarboxylic acid. The amount of the photopolymerization initiator (or system) to be used ranges from 0.05 to 100 parts by mass, preferably from 0.1 to 70 parts by mass and more preferably from 0.2 to 50 parts by mass per 100 parts by mass of ethylenically unsaturated bond-containing compound.

<Polymeric Binding Agent ((Polymer) Binder)>

The polymer binder used in the photopolymerizable light-sensitive layer of the presensitized plate useful for making a lithographic printing plates of the present invention should be a film-forming agent for the photopolymerizable composition and should be soluble in an alkali developer. Therefore, an organic polymer compound that is soluble or swellable in alkaline water may be used. Thus, if a water-soluble organic polymer is used as such an organic polymer, the resulting light-sensitive layer can be developed with water. Examples of such organic polymers include addition polymers having carboxyl groups on the side chains such as methacrylic acid copolymers, acrylic acid copolymers, itaconic acid copolymers, crotonic acid copolymers, maleic acid copolymers and partially esterified maleic acid copolymers as disclosed in J.P. KOKAI Nos. Sho 59-44615, 54-92723, 59-53836 and 59-71048 and J.P. KOKOKU Nos. 54-34327, 58-12577 and 54-25957.

An acidic cellulose derivative having a carboxyl group on the side chain can also be used in the present invention. In addition, a polymer prepared by adding a cyclic acid anhydride to an addition polymer having a hydroxyl group can be used. Among these compounds, suitably used herein include, for instance, [benzyl(meth)acrylate/(meth)acrylic acid/other optional addition-polymerizable vinyl monomer] copolymers and [allyl (meth)acrylate/(meth)acrylic acid/other optional addition-polymerizable vinyl monomer] copolymers. In addition, polyvinyl pyrrolidone and polyethylene oxide are useful as a water-soluble organic polymer. Alcohol-soluble polyamides and polyethers such as a reaction product of 2,2-bis-(4-hydroxyphenyl)-propane with epichlorohydrin are also useful for the improvement of the strength of the cured film. In addition, polyurethane resins described in J.P. KOKOKU Nos. Hei 7-120040, Hei 7-120041, Hei 7-120042 and Hei 8-12424; and J.P. KOKAI Nos. Sho 63-287944, Sho 63-287947, Hei 1-271741 and Hei 11-352691 are also useful in the present invention.

The introduction of a radically reactive group into the side chain of the above-described organic polymer compound would permit the improvement in the strength of the cured film. Examples of addition polymerizable groups include ethylenically unsaturated bond-containing groups, amino groups and epoxy groups. Examples of functional groups, which are converted into free radicals upon exposure to light include mercapto groups, thiol groups, halogen atoms, triazine structures and onium salt structures. In addition, examples of polar groups that may be present in the binder polymers include carboxyl groups and imide -groups. In particular, ethylenically unsaturated bond-containing groups such as acrylic, methacrylic, allyl and styryl groups are preferred as the foregoing addition polymerizable functional groups. Conveniently used herein also include functional groups selected from the group consisting of amino groups, hydroxyl groups, phosphonate residues, phosphate residues, carbamoyl groups, isocyanate groups, ureide groups, ureylene groups, sulfonate residues and ammonio groups.

In order to maintain the development performance of the composition, the polymer binder used in the present invention preferably has a suitable molecular weight and a suitable acid number. That is, a polymer compound having a weight average molecular weight ranging from 5,000 to 300,000 and having an acid number ranging from 20 to 200 may be effectively utilized. These polymer binders can be utilized in the photopolymerizable composition in any suitable amount. However, if the amount thereof exceeds 90% by mass, a problem would arise, for instance, the formed image may have an insufficient strength. Thus, the amount thereof preferably ranges from 10% to 90% by mass and more preferably 30% to 80% by mass. The weight ratio of the photopolymerizable ethylenically unsaturated bond-containing compound to the polymer binder preferably ranges from 1/9 to 9/1, more preferably 2/8 to 8/2 and further preferably 3/7 to 7/3.

<Additives>

Moreover, the light-sensitive layer usable in the present invention may desirably comprise a small amount of a heat polymerization inhibitor, in addition to the foregoing essential components, to inhibit unnecessary heat polymerization of the polymerizable ethylenically unsaturated bond-containing compound during the preparation of the light-sensitive composition or the storage thereof. Specific examples of such heat polymerization inhibitors effectively used herein are hydroquinone, p-methoxy-phenol, di-t-butyl-p-cresol, pyrogallol, t-butyl-catechol, benzoquinone, 4,4'-thiobis(3- methyl-6-t-butylphenol), 2,2'-methylenebis(4-methyl-6-t-butylphenol), N-nitrosophenyl-hydroxyl-amine cerium salt and N-nitrosophenyl-hydroxylamine aluminum salt. The amount of the heat polymerization inhibitor based on the total mass of the light-sensitive composition preferably ranges from about 0.01% to about 5% by mass. If necessary, a higher fatty acid derivative such as behenic acid and behenic acid amide may, for instance, be added to the light-sensitive composition in order to eliminate the polymerization-inhibitory action of oxygen. The higher fatty acid derivative may preferentially be distributed on the surface of the light-sensitive layer during the drying process after the application process. The amount of the higher fatty acid derivative is preferably in the range of from about 0.5% to about 10% by mass based on the total mass of the light-sensitive composition.

In addition, a coloring agent may be added to the light-sensitive layer to color the layer. Examples of such coloring agents include pigments, for instance, phthalocyanine pigments (such as C. I. Pigment Blue 15:3, 15:4, 15:6), azo pigments, carbon black and titanium oxide; and dyes such as ethyl violet, crystal violet, azo dyes, anthraquinone dyes and cyanine dyes. The amount of the dyes or pigments preferably ranges from about 0.5% to about 20% by mass on the basis of the total mass of the light-sensitive composition. Additionally, in order to improve the characteristic properties of the cured film, additives such as an inorganic filler and/or a plasticizer such as dioctyl phthalate, dimethyl phthalate and tricresyl phosphate, can be added. The amount of these additives is preferably not more than 10% by mass based on the total mass of the light-sensitive composition.

The light-sensitive composition used in the presensitized plate useful for making a lithographic printing plates of the present invention is dissolved in a variety of organic solvents prior to the application thereof onto the foregoing intermediate layer. Examples of such organic solvents usable herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone-alcohol, ethylene glycol monomethyl ether acetate, ethylene glycol ethyl ether acetate, ethylene glycol mono-isopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate-3-methoxypropyl acetate, N,N-dimethylformamide, dimethylsulfoxide, γ-butyrolactone, methyl lactate and ethyl lactate. The solvent can be used alone or in any combination thereof. The solid content in the coating solution suitably ranges from 1% to 50% by mass.

The photopolymerizable composition used in the light-sensitive layer of the presensitized plate useful for making a lithographic printing plates of the present invention may further comprise a surfactant to improve the surface quality of the coated film. The amount of the surfactant in the light-sensitive layer suitably ranges from about 0.1 $g/m^2$ to about 10 $g/m^2$, preferably 0.3 $g/m^2$ to 5 $g/m^2$, and more preferably 0.5 $g/m^2$ to 3 $g/m^2$, based on the mass of the dried light-sensitive layer.

[Protective Layer Having Oxygen-Barrier Property]

In general, a protective layer having oxygen-barrier properties is preferably applied onto the foregoing light-sensitive layer in order to eliminate the polymerization-inhibitory action of oxygen. Examples of water-soluble vinyl polymers to be incorporated into such a protective layer having oxygen-barrier properties include polyvinyl alcohol and partial esters, ethers or acetals thereof, and copolymers thereof each comprising a substantial amount of unsubstituted vinyl alcohol units that make the compounds water-soluble. Examples of such polyvinyl alcohol include polyvinyl alcohols, 71% to 100% of which is hydrolyzed and having a degree of polymerization ranging from 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, L-8 (available from Kuraray Co. Ltd.). Examples of such copolymers include polyvinyl acetate-chloroacetate or -propionate, polyvinyl formal and polyvinyl acetal, and copolymers thereof, 88% to 100% of which is hydrolyzed. In addition, examples of other useful polymers for obtaining the protective layer include polyvinyl pyrrolidone, gelatin and gum Arabic. The polymers can be used alone or in any combination.

A solvent to be used for coating the protective layer having oxygen-barrier properties is preferably pure water, but it may likewise be a blend of pure water and an alcohol such as methanol or ethanol and/or a ketone such as acetone or methyl ethyl ketone. The solid content in the coating solution suitably ranges from 1% to 20% by mass. In addition, the protective layer having oxygen-barrier properties may comprise known additives such as a surfactant for the improvement of the coating characteristics of the layer and a water-soluble plasticizer for the improvement of physical properties of the resulting film. Examples of such water-soluble plasticizers are propionamide, cyclohexanediol, glycerin and sorbitol. A water-soluble (meth)acrylic polymer may likewise be added to the protective layer. The amount of these additives after being dried suitably ranges from about 0.1 $g/m^2$ to about 15 $g/m^2$ and preferably about 1.0 $g/m^2$ to about 5.0 $g/m^2$.

[Plate-Making Method]

Then the method for making a lithographic printing plate using the presensitized plate therefor according to the present invention will be described below in detail. The foregoing presensitized plate for making a lithographic printing plate is imagewise exposed to light and then subjected to a developing treatment. The developer used in the plate-making method will be detailed below.

(Developer)

The developer used herein may be any conventionally known one. In particular, a particular developer specified below is preferably used in the present invention because of its excellent image-forming ability and good resistance to developing scum-formation.

Examples of such conventionally known developers are those disclosed in J.P. KOKOKU Sho 57-7427 and specific examples thereof suitably used herein are alkaline aqueous solution of, for instance, inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia; and organic alkali agents such as mono-ethanolamine and di-ethanolamine. These alkali agents are added to the developer so that the concentration thereof ranges from 0.1 to 10% by mass and preferably 0.5 to 5% by mass on the basis of the total mass of the developer.

Moreover, such an alkaline aqueous solution may, if necessary, comprise a small amount of a surfactant and/or an organic solvent such as benzyl alcohol, 2-phenoxy-ethanol or 2-butoxy-ethanol. Specific examples of such developers are those disclosed in, for instance, U.S. Pat. Nos. 3,375,171 and 3,615,480. In addition, developers also usable herein include, for instance, those disclosed in, for instance, J.P. KOKAI Nos. Sho 50-26601 and Sho 58-54341 and J.P. KOKOKU Nos. Sho 56-39464 and Sho 56-42860.

In addition, more preferred developers used in the plate-making process of the presensitized plate for a lithographic printing plate of the present invention are those comprising inorganic alkali salts and nonionic surfactants each having a polyoxy-alkylene ether group and having a pH value ranging from 11.0 to 12.7 and preferably 11.5 to 12.5. In the plate-making process of the presensitized plate for a lithographic printing plate of the present invention, such a developer may have a sufficient developing ability and the use thereof can prevent images from being damaged with the developer because of its low pH and therefore, it would be expected that the resulting printing plate has high printing durability.

The inorganic alkali salt usable herein may be any one, but specific examples thereof include a variety of inorganic alkali agents such as sodium hydroxide, potassium hydroxide, ammonium hydroxide, lithium hydroxide, sodium silicate, potassium silicate, ammonium silicate, lithium silicate, tri-sodium phosphate, tri-potassium phosphate, tri-ammonium phosphate, sodium carbonate, potassium carbonate, ammonium carbonate, sodium bicarbonate, potassium bicarbonate, ammonium bicarbonate, sodium borate, potassium borate and ammonium borate. These alkali agents may be used alone or in any combination When a silicate is used, the developing ability of the developer can easily be controlled by adjusting the mixing ratio of silicon dioxide $SiO_2$ and alkali metal oxide $M_2O$ as components of a silicate (wherein M is an alkali metal or an ammonium group) and the concentration thereof. The mixing ratio of said silicate $SiO_2$ to alkali metal oxide $M_2O$ (molar ratio: $SiO_2/M_2O$) in the aqueous alkali solution is 0.5 to 3.0 and preferably 1.0 to 2.0. If the ratio $SiO_2/M_2O$ is below 0.5, the developer sometimes suffers from a problem in that the developer may etch an aluminum substrate since the alkali strength thereof is too strong. In contrast, if the ratio exceeds 3.0, the development performance would be deteriorated. The content of the alkali silicate in the developer is preferably 1 to 10% by mass, more preferably 3 to 8% by mass and most preferably 4 to 7% by mass. If the content is less than 1% by mass, the developing and processing abilities thereof may be deteriorated. If the content is more than 10% by mass, precipitates and/or crystals would easily be formed in the developer and moreover, the developer easily gelates when it is neutralized upon disposal, which may interfere with the treatment of waste liquor.

Alternatively, an organic alkali agent may be used as an auxiliary agent to aid the delicate control of the alkali concentration and the improvement of the solubility of the light-sensitive layer in the developer. Examples of such organic alkaline agents include mono-methylamine, dimethylamine, trimethylamine, mono-ethylamine, diethylamine, triethylamine, mono-isopropylamine, di-isopropylamine, tri-isopropyl-amine, n-butylamine, mono-ethanolamine, diethanolamine, triethanolamine, mono-isopropanolamine, diisopropanolamine, ethyleneimine, ethylenediamine, pyridine, tetramethyl ammonium hydroxide. These alkaline agents can be used alone or in any combination.

It is essential for the developer used in the method of the present invention that it comprises a nonionic surfactant having a polyoxyalkylene ether group. The addition of this nonionic surfactant to the developer would permit the improvement of the solubility of unexposed areas on the light-sensitive layer and the reduction in the permeability of the developer into exposed areas on the light-sensitive layer. The following compound represented by the general formula (I) can suitably be used herein as the surfactant carrying a polyoxyalkylene ether group.

In the formula (I), $R^{40}$ represents an optionally substituted alkyl group having 3 to 15 carbon atoms, an optionally substituted aromatic hydrocarbon group having 6 to 15 carbon atoms or an optionally substituted aromatic heterocyclic group having 4 to 15 carbon atoms, wherein the substituent(s) on these groups may be alkyl groups each having 1 to 20 carbon atoms, halogen atoms such as Br, Cl and I, aromatic hydrocarbon groups each having 6 to 15 carbon atoms, aralkyl groups each having 7 to 17 carbon atoms, alkoxy groups each having 1 to 20 carbon atoms, alkoxy-carbonyl groups each having 2 to 20 carbon atoms and/or acyl groups each having 2 to 15 carbon atoms; $R^{41}$ represents an optionally substituted alkylene group having 1 to 100 carbon atoms, wherein the substituent on the group may be an alkyl group having 1 to 20 carbon atoms or aromatic hydrocarbon group having 6 to 15 carbon atoms; and "p" represents an integer of 1 to 100.

In the definition of Formula (I), specific examples of "aromatic hydrocarbon groups" include phenyl group, tolyl group, naphthyl group, anthryl group, biphenyl group and phenanthryl group; specific examples of "aromatic heterocyclic groups" include furyl group, thionyl group, oxazolyl group, imidazolyl group, pyranyl group, pyridinyl, acridinyl group, benzofuranyl group, benzothionyl group, benzopyranyl group, benzoxazolyl group and benzimidazolyl group.

In addition, the moiety: $(R^{41}-O)_p$ in Formula (I) may comprise at least two kinds, preferably two or three kinds of groups inasmuch as they fall within the foregoing range. Specific examples of such groups include a combination of ethyleneoxy group and propyleneoxy group, a combination of ethyleneoxy group and isopropyloxy group, a combination of ethyleneoxy group and butyleneoxy group and a combination of ethyleneoxy group and isobutylene group, in which the plurality of these groups are linked together in a random or block manner. In the present invention, the nonionic surfactant comprising a polyoxyalkylene ether group may be used alone or in any combination. An effective amount of the surfactant to be used in a developer is in the range of from 1 to 30% by mass and preferably 2 to 20% by mass. If the amount of the surfactant is too small, the development performance of the developer would be deteriorated. If the amount of the surfactant is too high, the imagewise exposed plate is greatly damaged by the developer and the printing durability of the resulting printing plate would be deteriorated.

Examples of such nonionic surfactants each carrying a polyoxyalkylene ether group represented by the foregoing general formula (I) include polyoxyethylene alkyl ethers such as polyoxyethylene lauryl ether, polyoxyethylene cetyl ether and polyoxy-ethylene stearyl ether; polyoxyethylene aryl ethers such as polyoxyethylene phenyl ether and polyoxyethylene naphthyl ether; and polyoxyethylene alkylaryl ethers such as polyoxyethylene methyl-phenyl ether, polyoxyethylene octyl-phenyl ether and polyoxyethylene nonylphenyl ether.

Further, other surfactants listed below may be added to the developer used in the present invention. Examples of other surfactants are nonionic surfactants, for instance, polyoxyethylene alkyl esters such as polyoxyethylene stearate, sorbitan alkyl esters such as sorbitan monolaurate, sorbitan monostearate, sorbitan distearate, sorbitan monooleate, sorbitan sesqui-oleate and sorbitan trioleate, and monoglyceride alkyl esters such as glycerol monostearate and glycerol monooleate; anionic surfactants, for instance, salts of alkylbenzene-sulfonic acid such as sodium dodecylbenzene-sulfonate, salts of alkylnaphthalene-sulfonic acid such as sodium butyl-naphthalene-sulfonate, sodium pentyl-naphthalene-sulfonate, sodium hexyl-naphthalene-sulfonate and sodium octyl-naphthalene-sulfonate, alkyl sulfuric acid salts such as sodium lauryl-sulfate, salts of alkyl-sulfonic acid such as sodium dodecyl-sulfonate and salts of sulfosuccinic acid esters such as sodium di-lauryl-sulfosuccinate; and amphoteric surfactants, for instance, alkyl-betaines such as lauryl-betaine and stearyl-betaine, and amino acids with the anionic surfactants such as alkyl-naphthalene-sulfonic acid salt being particularly preferred.

These surfactants may be used alone or in any combination. The amount of the surfactant in the developer is suitably in the range of from 0.1 to 20% by mass, which the amount is calculated based on the weight of the effective component in the surfactant.

The preferred pH of the developer used in the present invention is in the range of from 11.0 to 12.7 and preferably of 11.5 to 12.5. If the pH of the developer is lower than 11.0, it is not possible to form an image. In contrast, if the pH of the developer is higher than 12.7, the developer suffers from such problems that the imagewise exposed plate is often developed in excess and that the exposed areas are considerably damaged during the development.

The developer utilized in the present invention preferably has a conductivity in the range of from 3 mS/cm to 30 mS/cm. If the conductivity of the developer is less than the lower limit, it is generally difficult to elute (dissolve) the light-sensitive composition on an aluminum substrate to thus result in a contamination of the plate during printing process. If the conductivity is higher than the upper limit, an elution rate of the light-sensitive composition becomes so slow that remains (remaining film) are left on the unexposed areas because of a high salt concentration. The conductivity particularly preferably falls within the range of from 5 mS/cm to 20 mS/cm.

(Exposure to Light and Development)

The presensitized plate for making a lithographic printing plate according to the present invention is imagewise exposed to a conventional active light rays emitted from, for instance, carbon arc lamps, high pressure mercury lamps, xenon lamps, metal halide lamps, fluorescent lamps, tungsten lamps, halogen lamps, a helium-cadmium laser, an argon ion laser, an FD•YAG laser, a helium-neon laser and a semiconductor laser (whose wavelength ranges from 350 nm to 600 nm). Then, the imagewise exposed plate is developed with a developer to form an image on the surface of the aluminum plate. In any stage after the imagewise exposure of the presensitized plate and before the development thereof, the plate may be heated to a temperature ranging from 50 to 150° C. for one second to 5 minutes in order to improve the degree of cure of the photopolymerizable light-sensitive layer.

Typically, an overcoat layer, having oxygen-barrier properties, is applied onto the light-sensitive layer of the presensitized plate of the present invention, as has been described above. It is known that such an overcoat layer may be removed simultaneously with the removal of the unexposed area on the light-sensitive layer with a developer, or may be removed with water or hot water before the removal of the unexposed area on the light-sensitive layer with a developer. Such water or hot water may comprise preservatives as described in J.P. KOKAI Hei 10-10754 and organic solvents as described in J.P. KOKAI Hei 8-278636.

The development of the imagewise exposed plate of the present invention with the developer described above may be conducted according to the usual method, which comprises the steps of, for instance, immersing the imagewise exposed plate in the developer at 0 to 60° C., preferably 15 to 40° C. and then rubbing the plate with a brush.

In addition, in case where the developing treatment is conducted using an automatic developing machine, the developing ability of the developer used therein may be recovered by adding a replenisher or a fresh developer since the developer is fatigued in proportion to the throughput of the machine or the increase in the number of imagewise exposed plates.

Then the presensitized plate for making a lithographic printing plate thus treated is generally post-treated with washing-water, a rinse comprising, for instance, a surfactant and/or a desensitizing solution comprising, for instance, gum Arabic and/or starch derivatives, as described in J.P. KOKAI Nos. Sho 54-8002, Sho 55-115045, and Sho 59-58431. The post-treatments of the plate of the present invention may comprise various combinations of the foregoing treatments.

The lithographic printing plate thus obtained may further be subjected to a post-exposure treatment and/or a heat treatment such as a burning, as described in J.P. KOKAI 2000-89478 to improve the printing durability of the resulting printing plate.

The lithographic printing plate thus obtained is set on an offset printing press and then is operated to obtain a large number of printed matters.

The present invention will hereunder be described in more detail with reference to the following working Examples, but the present invention is not restricted to these specific Examples at all.

1. Preparation of Substrate for Lithographic Printing Plate

EXAMPLE 1

<Aluminum Plate>

A melt was prepared using an aluminum alloy containing 0.06% by mass of Si, 0.30% by mass of Fe, 0.005% by mass of Cu, 0.001% by mass of Mn, 0.001% by mass of Mg, 0.001% by mass of Zn, 0.03% by mass of Ti, a balance of Al and inevitable impurities, followed by a melting treatment, a filtration treatment and preparation of an ingot having a thickness of 500 mm and a width of 1200 mm according to the DC casting method. The surface of the ingot was scraped off at an average thickness of 10 mm using a facing machine, followed by maintaining the ingot at a temperature of 550° C. for about 5 hours for soaking and forming it into a rolled plate having a thickness of 2.7 mm using a hot-rolling mill when the ingot was cooled down to a temperature of 400° C. Further, the rolled plate was heat-treated at 500° C. using a continuous annealing machine and then the thickness of the plate was reduced to 0.24 mm through cold rolling to thus give an aluminum plate of JIS 1050 material. The width of this aluminum plate was adjusted to 1030 mm and then the plate was subjected to the following surface treatment.

<Surface Treatment>

The aluminum plate was subjected to a surface treatment by continuously conducting the following various kinds of treatments (b) to (j). In this respect, any liquid was squeezed out from the plate by passing it through nip rolls after each treatment and water washing steps.

(b) Alkali Etching Treatment: The aluminum plate prepared according to the foregoing method was subjected to an etching treatment by spraying an aqueous solution having a caustic soda concentration of 2.6% by mass, an aluminum ion concentration of 6.5% by mass and a temperature of 70° C. on the surface of the plate to thus dissolve the aluminum plate in an amount of 6 g/m$^2$. Thereafter, the aluminum plate was washed with water by spraying water on the plate.

(c) Desmutting Treatment: The aluminum plate was subjected to a desmutting treatment by spraying a 1% by mass aqueous nitric acid solution maintained at 30° C. (containing 0.5% by mass of aluminum ions) on the plate and then washed with water by spraying water on the plate. The nitric acid aqueous solution used in the desmutting treatment was the waste liquor obtained in the process for electrochemically surface roughening the aluminum plate in a nitric acid aqueous solution using an alternating current.

Figure 2:
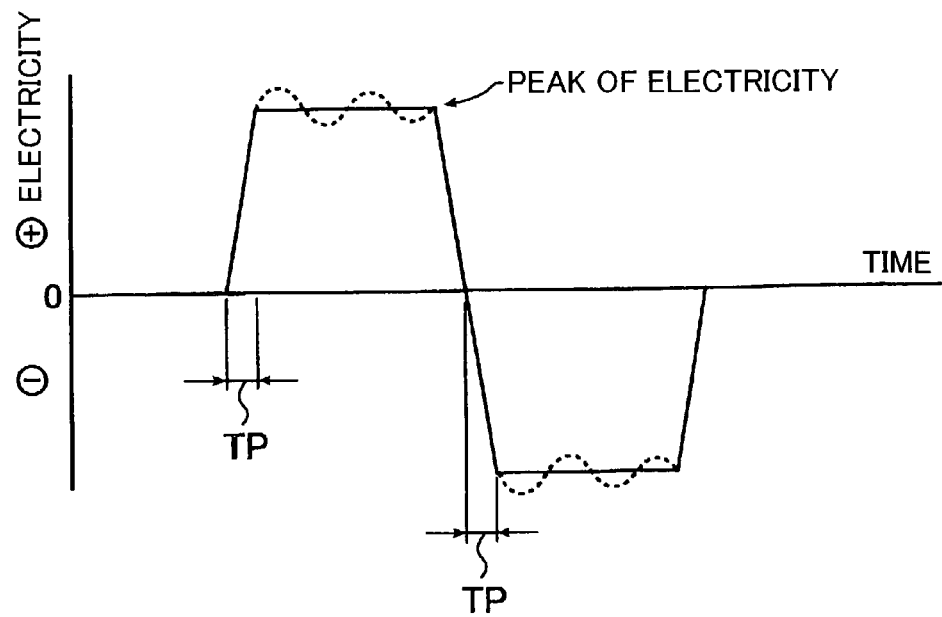
FIG. 2 is a graph showing an example of the waveform of the alternating waved current used in the electrochemical surface roughening treatment, in the production of the substrate for making a lithographic printing plate according to the present invention.

(d) Electrochemical Surface-Roughening Treatment: The aluminum plate was continuously electrochemically surface-roughened using an alternating voltage of 60 Hz. In this treatment, the electrolyte used was a 10.5 g/L aqueous nitric acid solution (containing 5 g/L of aluminum ions and 0.007% by mass of ammonium ions) maintained at a temperature of 50° C. The alternating voltage used had a waveform as shown in FIG. 2. The electrochemical surface-roughening treatment was carried out using a trapezoidal rectangular waved alternating current whose TP or the time required for the current to reach its peak level from zero level was 0.8 msec and a duty ratio of 1:1 and a carbon electrode as the counter electrode. Ferrite was used as an auxiliary anode. The electrolyzation tank as shown in FIG. 3 was herein used.

The current density was set at a level of 30 A/dm$^2$ as expressed in terms of the peak value of the current and the quantity of electricity was found to be 220 C/dm$^2$ as expressed in terms of the quantity of anode time electricity. A part (5%) of the current from the power supply was branched into the auxiliary anode.

Thereafter, the aluminum plate was washed with water by the spray washing.

(e) Alkali Etching Treatment: The aluminum plate was subjected to an etching treatment at a temperature of 32° C. by spraying an aqueous solution having a caustic soda concentration of 26% by mass and an aluminum ion concentration of 6.5% by mass on the surface of the plate. The aluminum plate was dissolved by the etching treatment in an amount of 0.25 g/m$^2$ and this permitted the removal of the smut components mainly comprising aluminum hydroxide formed during the foregoing electrochemical surface-roughening treatment using an alternating current and the edge portions of pit formed were dissolved by the etching treatment so that the edge portions were smoothened. Thereafter, the aluminum plate was washed with water by the spray washing.

(f) Desmutting Treatment: The aluminum plate was subjected to a desmutting treatment by spraying a 15% by mass aqueous sulfuric acid solution maintained at 30° C. (containing 4.5% by mass of aluminum ions) on the plate and then washed with water by spraying water on the plate. The nitric acid aqueous solution used in the desmutting treatment was the waste liquor obtained in the process for electrochemically surface roughening the aluminum plate in a nitric acid aqueous solution using an alternating current.

(g) Electrochemical Surface-Roughening Treatment: The aluminum plate was continuously electrochemically surface-roughened using an alternating voltage of 60 Hz. In this treatment, the electrolyte used was a 7.5 g/L aqueous hydrochloric acid solution (containing 5 g/L of aluminum ions) maintained at a temperature of 50° C. The alternating voltage used had a waveform as shown in FIG. 2. The electrochemical surface-roughening treatment was carried out using a trapezoidal rectangular waved alternating current whose TP or the time required for the current to reach its peak level from zero level was 0.8 msec and a duty ratio of 1:1 and a carbon electrode as the counter electrode. Ferrite was used as an auxiliary anode. The electrolyzation tank as shown in FIG. 3 was herein used.

The current density was set at a level of 25 A/dm$^2$ as expressed in terms of the peak value of the current and the quantity of electricity was found to be 50 C/dm$^2$ as expressed in terms of the quantity of anode time electricity.

Thereafter, the aluminum plate was washed with water by the spray washing.

(h) Alkali Etching Treatment: The aluminum plate was subjected to an etching treatment at a temperature of 32° C. by spraying an aqueous solution having a caustic soda concentration of 26% by mass and an aluminum ion concentration of 6.5% by mass on the surface of the plate. The aluminum plate was dissolved by the etching treatment in an amount of 0.10 g/m$^2$ and this permitted the removal of the smut components mainly comprising aluminum hydroxide formed during the foregoing electrochemical surface-roughening treatment using an alternating current and the edge portions of pit formed were dissolved by the etching treatment so that the edge portions were smoothened. Thereafter, the aluminum plate was washed with water by the spray washing.

(i) Desmutting Treatment: The aluminum plate was subjected to a desmutting treatment by spraying a 25% by mass aqueous sulfuric acid solution maintained at 60° C. (containing 0.5% by mass of aluminum ions) on the plate and then washed with water by spraying the plate with water.

(j) Anodization Treatment: The aluminum plate was subjected to an anodization treatment using an anodization device having a structure as shown in FIG. 4 to thus give a substrate for making a lithographic printing plate of Example 1. Sulfuric acid solutions were used as electrolytes supplied to first and second electrolyzation zones. The both electrolytes had a sulfuric acid concentration of 170 g/L (containing 0.5% by mass of aluminum ions) and a temperature of 38° C. Thereafter, the aluminum plate was washed with water by the spray washing. The amount of the ultimately formed anodized layer or film was found to be 2.7 g/m$^2$.

EXAMPLES 2 and 3

The substrates of Examples 2 and 3 for making lithographic printing plates were prepared by repeating the same procedures used in Example 1 except that in the foregoing step (h), the amount of the aluminum plate dissolved out was changed to 0.2 g/m² and 0.5 g/m², respectively.

EXAMPLES 4 and 5

The substrates of Examples 4 and 5 for making lithographic printing plates were prepared by repeating the same procedures used in Example 1 except that in the foregoing step (g), the frequency of the alternating voltage used was changed to 300 or 500 Hz.

EXAMPLE 6

The substrate of Example 6 for making a lithographic printing plate was prepared by repeating the same procedures used in Example 1 except that in the foregoing step (d), the current density was set at a level of 15 A/dm² as expressed in terms of the peak value of the current.

EXAMPLE 7

The substrate of Example 7 for making a lithographic printing plate was prepared by repeating the same procedures used in Example 1 except that in the foregoing step (d), the temperature of the electrolyte was changed to 70° C.

EXAMPLE 8

The substrate of Example 8 for making a lithographic printing plate was prepared by repeating the same procedures used in Example 1 except that the following step (a) was carried out prior to the foregoing step (b).

EXAMPLE 9

The substrate of Example 9 for making a lithographic printing plate was prepared by repeating the same procedures used in Example 4 except that the following step (a) was carried out prior to the foregoing step (b).

EXAMPLE 10

The substrate of Example 10 for making a lithographic printing plate was prepared by repeating the same procedures used in Example 6 except that the following step (a) was carried out prior to the foregoing step (b).

(a) Mechanical Surface-Roughening Treatment: The aluminum plate was mechanically surface-roughened by rotating a roll-like nylon brush while supplying a slurry of an abrasive (pumice stone having a specific gravity of 1.12) and water as an abrasive slurry solution on the surface of the plate using a device as shown in FIG. 1. In FIG. 1, the reference numeral 1 represents an aluminum plate, 2 and 4 roll-like brushes, 3 an abrasive slurry solution, and 5, 6, 7 and 8 support rolls. The average particle size of the abrasive was found to be 40 μm and the peak particle size thereof was 100 μm. The material for the roll-like nylon brush was 6,10-nylon and the filling thereof had a length of 50 mm and a diameter of 0.3 mm. The nylon brush was produced by making holes on the wall of a stainless steel cylinder having a φ of 300 mm and then densely implanting fillings. Three rotatable brushes were used herein. The distance between two support rolls (φ 200 mm) behind the brushes was found to be 300 mm. The brush rolls were pressed against the aluminum plate till the load of a driving motor for rotating the brush reached 7 kW+the load of the motor (observed prior to the pressing the brush to the plate). The rotating direction of the brush was identical to the traveling direction of the aluminum plate. The rotational frequency of the brush was set at 200 rpm.

EXAMPLE 11

The substrate of Example 11 for making a lithographic printing plate was prepared by repeating the same procedures used in Example 8 except that silica sand was substituted for the abrasive used in the foregoing step (a).

EXAMPLE 12

The substrate of Example 12 for making a lithographic printing plate was prepared by repeating the same procedures used in Example 11 except that in the foregoing step (a), the rotational frequency of the brush was set at 100 rpm.

EXAMPLE 13

The substrate of Example 13 for making a lithographic printing plate was prepared by repeating the same procedures used in Example 1 except that the following step (z) was conducted prior to the foregoing step (b). (z) Honing Treatment: A suspension of iron spheres having a particle size of 100 μm in water was sprayed on the aluminum plate under pressure to thus make the surface uneven.

EXAMPLE 14

The substrate of Example 14 for making a lithographic printing plate was prepared by repeating the same procedures used in Example 8 except that the internationally registered alloy 3103 was substituted for the JIS1050 as the raw material.

COMPARATIVE EXAMPLE 1

The substrate of Comparative Example 1 for making a lithographic printing plate was prepared by repeating the same procedures used in Example 3 except that in the foregoing step (g), the frequency of the alternating voltage was changed to 10 Hz.

COMPARATIVE EXAMPLE 2

The substrate of Comparative Example 2 for making a lithographic printing plate was prepared by repeating the same procedures used in Example 1 except that in the foregoing step (g), the frequency of the alternating voltage was changed to 10 Hz and that in the foregoing step (h), the aluminum plate was dissolved out in an amount of 1.0 g/m².

COMPARATIVE EXAMPLE 3

The substrate of Comparative Example 3 for making a lithographic printing plate was prepared by repeating the same procedures used in Example 1 except that in the foregoing step (d), the frequency of the alternating voltage was changed to 15 Hz.

COMPARATIVE EXAMPLE 4

The substrate of Comparative Example 4 for making a lithographic printing plate was prepared by repeating the same procedures used in Example 1 except that in the foregoing step (d), the temperature of the electrolyte was set at 80° C. and that the TP value was set at 0 msec.

COMPARATIVE EXAMPLE 5

The substrate of Comparative Example 5 for making a lithographic printing plate was prepared by repeating the same procedures used in Example 7 except that in the foregoing step (g), the frequency of the alternating voltage was changed to 10 Hz and that in the foregoing step (h), the aluminum plate was dissolved out in an amount of 1.0 g/m$^2$.

COMPARATIVE EXAMPLE 6

The substrate of Comparative Example 6 for making a lithographic printing plate was prepared by repeating the same procedures used in Example 8 except that the foregoing steps (g), (h) and (i) were omitted.

COMPARATIVE EXAMPLE 7

The substrate of Comparative Example 7 for making a lithographic printing plate was prepared by repeating the same procedures used in Example 1 except that the foregoing steps (g), (h) and (i) were omitted.

COMPARATIVE EXAMPLE 8

The substrate of Comparative Example 8 for making a lithographic printing plate was prepared by repeating the same procedures used in Example 1 except that the foregoing steps (d), (e) and (f) were omitted and that in the foregoing step (g), the quantity of electricity was set at 500 C/dm$^2$ as expressed in terms of the total quantity of electricity observed when the aluminum plate was used as an anode (total quantity of anode time electricity).

COMPARATIVE EXAMPLES 9 AND 10

The substrates of Comparative Examples 9 and 10 for making lithographic printing plates were prepared by repeating the same procedures used in Comparative Example 8 except that in the foregoing step (h), the aluminum plate was dissolved out in amounts of 0.2 g/m$^2$ and 0.5 g/m$^2$.

COMPARATIVE EXAMPLE 11

The substrate of Comparative Example 11 for making a lithographic printing plate was prepared by repeating the same procedures used in Example 8 except that the foregoing steps (d), (e), (f), (g), (h) and (i) were omitted.

COMPARATIVE EXAMPLE 12

The substrate of Comparative Example 12 for making a lithographic printing plate was prepared by repeating the same procedures used in Example 1 except that the foregoing steps (d), (e) and (f) were omitted.

COMPARATIVE EXAMPLE 13

The substrate of Comparative Example 13 for making a lithographic printing plate was prepared by repeating the same procedures used in Example 8 except that the foregoing steps (d), (e) and (f) were omitted.

COMPARATIVE EXAMPLE 14

The substrates of Comparative Example 14 for making a lithographic printing plate was prepared by repeating the same procedures used in Comparative Example 9 except for using, in the foregoing step (g), a mixed liquid containing hydrochloric acid and acetic acid (hydrochloric acid concentration 7.5 g/L; acetic acid concentration 15 g/L) as the electrolyte.

COMPARATIVE EXAMPLE 15

The substrate of Comparative Example 15 for making a lithographic printing plate was prepared by repeating the same procedures used in Example 1 except that in the foregoing step (g), the frequency of the alternating voltage was changed to 30 Hz and that the foregoing step (h) was omitted.

COMPARATIVE EXAMPLE 16

The substrate of Comparative Example 16 for making a lithographic printing plate was prepared by repeating the same procedures used in Comparative Example 15 except that the foregoing step (a) was carried out prior to the foregoing step (b).

COMPARATIVE EXAMPLE 17

The substrate of Comparative Example 17 for making a lithographic printing plate was prepared by repeating the same procedures used in Example 7 except that the foregoing step (a) was carried out prior to the foregoing step (b).

2. Determination of Surface Structure of Substrate for Lithographic Printing Plate Regarding the concave portions on the surface of the substrate for making a lithographic printing plate prepared above, there were conducted the following measurements (1) to (4).

The results thus obtained are listed in the following Table 1. In Table 1, the symbol "–" means that there was not observed any concave portion having the corresponding wavelength.

(1) Determination of the Average Pore Size of the Medium Waved Structure

The average pore size of the medium waved structure was determined by taking a photograph of the surface of a substrate to be examined in the direction just above the same using an SEM of 2000 magnification, selecting at least 50 pits having the medium waved structure (medium waved pits), the peripheries of which are connected with each other like a ring, among the pits present in the SEM micrograph and reading the diameter thereof as the pore diameter.

(2) Determination of the Average Pore Size of the Small Waved Structure

The average pore size was calculated by taking a photograph of the surface of a substrate to be examined from the direction just above the surface using a high resolution SEM of 50000 magnification, selecting at least 50 pits having the medium waved structure (small waved pits) among the pits present in the SEM micrograph and reading the diameter thereof as the pore diameter.

(3) Determination of the Average Ratio of the Depth to the Pore Size of the Small Waved Structure This average ratio of the depth to the pore size was calculated by taking a photograph of a fractured section of a substrate to be examined using a high resolution SEM of 50000 magnification, selecting at least 20 small waved pits having a pore size of not more than 0.3 µm among the pits present in the SEM micrograph, reading the pore diameter and depth thereof and calculating the ratio and then averaging the same.

(4) Determination of the Average Wavelength of the Large Waved Structure

The two-dimensional surface roughness was determined using a tracer type surface roughness tester (SUFCOM575 available from Tokyo Seimitsu Co., Ltd.) and the average peak-to-peak distance Sm specified in IOS4287 was determined for 5 times to calculate the average thereof, which was defined to be the average wavelength. The two-dimensional surface roughness was determined under the following conditions: Cut off: 0.8; slope correction: FLAT-ML; measuring length: 3 mm; longitudinal magnification: 10000; scanning rate: 0.3 mm/sec; and diameter of tracer tip: 2 µm.

Presensitized Plate for Making Lithographic Printing Plate:

A presensitized plate useful for making a lithographic printing plate was prepared by forming, on the substrate prepared above, a combination of an intermediate layer and a light-sensitive layer as shown in the following Tables 2 to 4 in this order.

Intermediate Layer

Intermediate Layer 1

The following intermediate layer-coating composition 1 for surface-treatment was coated on the substrate in such an amount that the amount of P was equal to about 0.05 g/m² followed by drying the coated layer at 100° C. for one minute to form an intermediate layer 1.

| <Intermediate layer-coating composition 1> | |
|---|---|
| Phenyl-phosphonic acid | 2 parts by mass |
| Methanol | 800 parts by mass |
| Water | 50 parts by mass |

Intermediate Layer 2:

The following intermediate layer-coating composition 2 for surface-treatment was coated on the substrate in such an amount that the amount of Si was equal to about 0.001 g/m² followed by drying the coated layer at 100° C. for one minute to form an intermediate layer 2.

<Intermediate Layer-Coating Composition 2>

When the following components were admixed together and stirred, an exothermic reaction took place after about 5 minutes. After the reaction was continued over 60 minutes, the content of the reactor was transferred to another container and methanol was additionally added in an amount of 30000 parts by mass to give a liquid composition 2.

| PHOSMER PE available from Uni-Chemical Co., Ltd. | 20 parts by mass |
|---|---|
| Methanol | 130 parts by mass |
| Water | 20 parts by mass |
| p-Toluene-sulfonic acid | 5 parts by mass |
| Tetra-ethoxy-silane | 50 parts by mass |
| 3-Methacryloxypropyl trimethoxy-silane | 50 parts by mass |

Intermediate Layer 3:

There was coated, on the substrate, a solution obtained by dissolving methyl methacrylate/ethyl acrylate/sodium 2-acrylamide-2-methylpropane sulfonate copolymer (molar ratio: 60/25/15; molecular weight Mn=30000) in a water/methanol mixture (5 g/95 g) so that the coated amount of the solution was equal to 3 mg/m² and then the coated layer was dried at 80° C. for 30 seconds to thus give an intermediate layer 3.

A solution obtained by dissolving the following polymer U-1 (molecular weight Mn=10000) in a water/methanol mixture (5 g/95 g) was applied onto the aluminum plate thus treated and the coated layer of the solution was dried at 80° C. for 30 seconds. At this stage, the thickness of the intermediate layer was found to be 10 mg/m². Then a highly sensitive photopolymerizable composition P-1 having the following composition was applied onto the intermediate layer such that the coated amount of the composition weighed after drying was equal to 1.5 g/m² and then the composition was dried at 100° C. for one minute to form a light-sensitive layer.

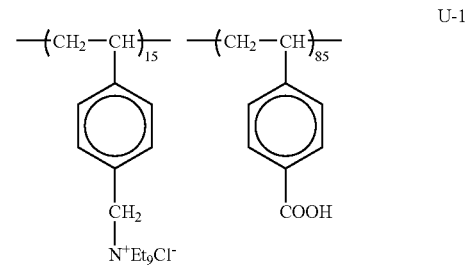

Light-Sensitive Layer

Light-Sensitive Layers 1 to 7 (Examples 1 to 7)

A highly sensitive photopolymerizable composition having the following composition was applied onto the foregoing intermediate layer such that the coated amount of the composition weighed after drying was equal to 1.5 g/m² and then the composition was dried at 100° C. for one minute to form a light-sensitive layer.

(Photopolymerizable Composition)

| Ethylenically unsaturated bond-containing compound | See the following Table 1 |
|---|---|
| Linear organic high molecular weight polymer (polymer binder) | See Table 1 |
| Sensitizer | See Table 1 |
| Photopolymerization initiator | See Table 1 |
| γ-Phthalocyanine (F1) dispersion | 0.3% by mass |
| Fluorine atom-containing surfactant Megafack F176PF (available from Dainippon Ink and Chemicals, Inc.) | 0.03% by mass |
| Methyl ethyl ketone | 25% by mass |
| Propylene glycol monomethyl ether acetate | 25% by mass |

Comparative Light-Sensitive Layers 8 to 10

The same procedures used for preparing the light-sensitive layers 1 to 7 were repeated except for using ethylenically unsaturated bond-containing compounds AR1 to AR3 to thus prepare comparative light-sensitive layers.

TABLE 1
| Ex. Comp. Ex. | Light-sensitive layer No. | Initiator | | Monomer 1 | | Monomer 2 | | Binder | Sensitizer | | Intermediate Layer | Developer | Exposure |
|---|---|---|---|---|---|---|---|---|---|---|---|---|---|
| Ex. | 1 | D1 | (0.2) | A1 | (1.5) | | | B1 | C1 | (0.2) | 1 | 1 | 1 |
| Ex. | 2 | D1 | (0.2) | A1 | (0.7) | A5 | (0.8) | B1 | C1 | (0.15) | None | 1 | 1 |
| Ex. | 3 | D1 | (0.5) | A2 | (1.5) | | | B2 | C1 | (0.1) | 2 | 1 | 1 |
| Ex. | 4 | D1 | (0.5) | A2 | (0.9) | A4 | (0.6) | B2 | C1 | (0.12) | 4 | 2 | 1 |
| Ex. | 5 | D1 | (0.1) | A1 | (1.7) | | | B1 | C2 | (0.2) | 3 | 1 | 2 |
| Ex. | 6 | D1 | (0.1) | A1 | (0.9) | A3 | (0.8) | B1 | C2 | (0.3) | 4 | 1 | 2 |
| Ex. | 7 | D2 | (0.6 | A1 | (0.5) | A3 | (1.1) | B1 | C3 | 0.3) | None | 1 | 2 |
| Comp. Ex. | Comp. 8 | D1 | (0.2) | AR1 | 1.5) | | | B1 | C1 | (0.2) | 2 | 1 | 1 |
| Comp. Ex. | Comp. 9 | D1 | 0.5) | AR2 | (0.9 | A4 | (0.6) | B2 | C1 | (0.12) | 4 | 2 | 1 |
| Comp. Ex. | Comp. 10 | D1 | (0.1) | AR3 | (1.7) | | | B1 | C2 | (0.2) | 3 | 1 | 2 |
Note: The numerical value in parentheses means the amount as expressed in terms of part by mass.
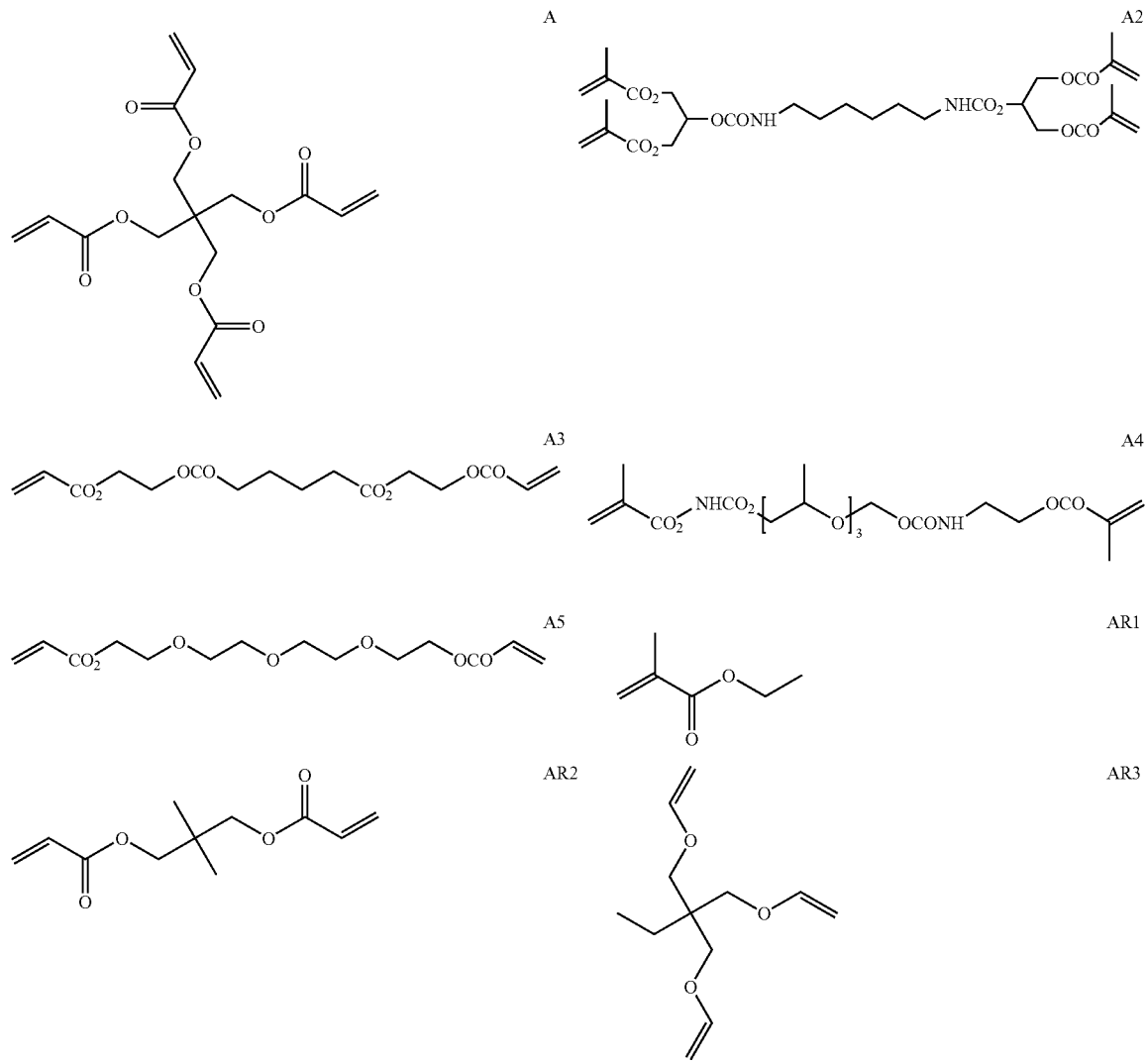

-continued

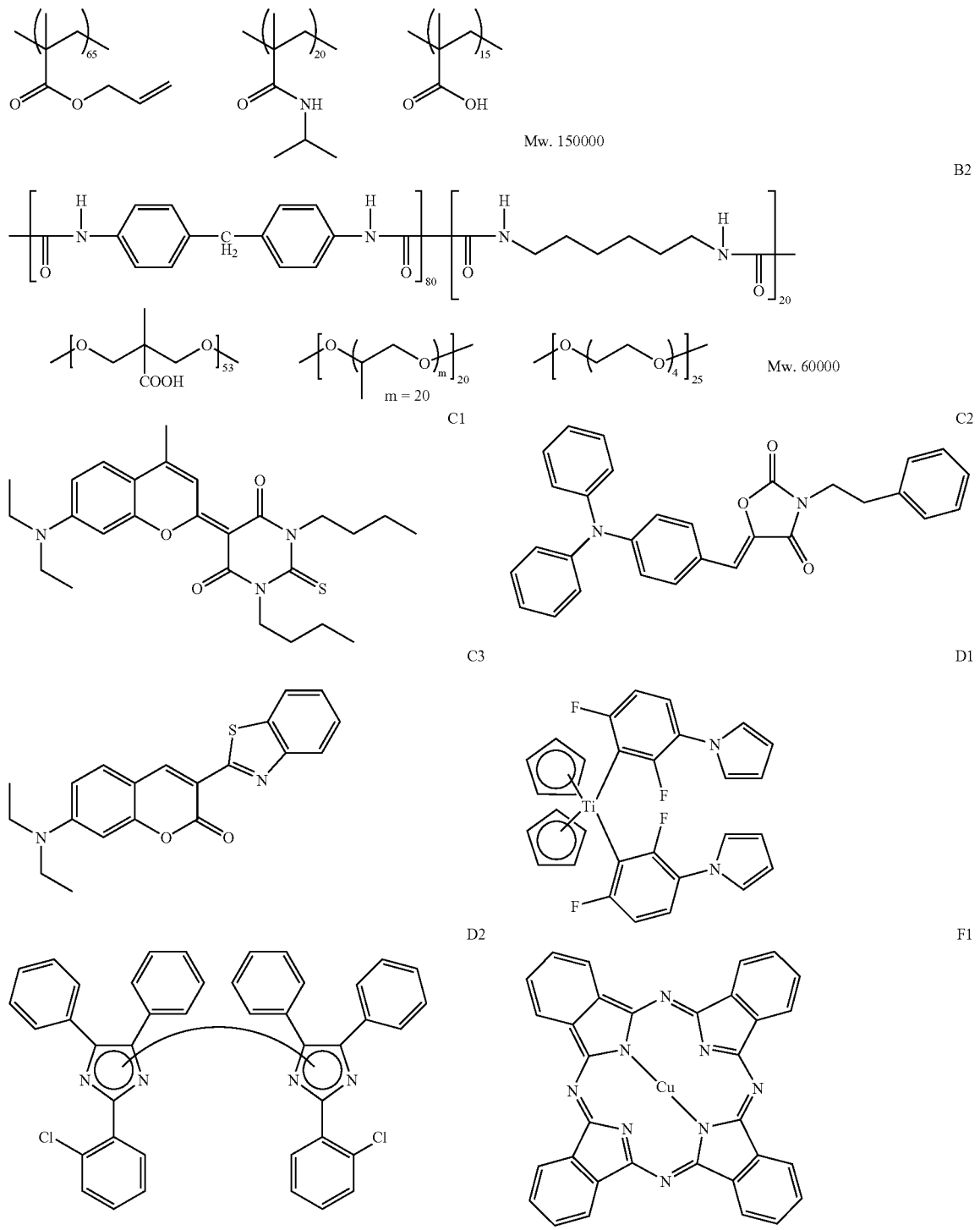

Protective Layer

Subsequently, a 6% by mass aqueous solution having the following composition was applied onto the foregoing light-sensitive layer in an amount such that the dry coated mass of the solution was 2.5 g/m² and then the coated layer was dried at 100° C. for 1.5 minute to give a presensitized plate useful for making a lithographic printing plate (light-sensitive material).

| | |
|---|---|
| Polyvinyl alcohol (degree of saponification: 98 mole %; degree of polymerization: 500) | 85 parts by mass |
| Polyvinyl pyrrolidone (K-30) | 13 parts by mass |
| Surfactant (EMALEX 710) | 2 parts by mass |
| Pure water | |

Exposure to Light

Exposure 1 (Light-Sensitive Layers 1 to 4, 8 and 9)

The presensitized plates for lithographic printing plates having the light-sensitive layers 1 to 4, 8 and 9 were subjected to scanning exposure to light emitted from an FD-YAG laser (Plate Jet 4 available from CSI Company) at an exposure value of 100 μJ/cm$^2$, to thus form a solid image under the condition of 175 lines/inch at 4000 dpi and 1 to 99% half-tone dot images (at intervals of 1%).

Exposure 2 (Light-Sensitive Layers 5 to 7 and 10)

The presensitized plates having these light-sensitive layers were exposed to light by repeating the same procedures used above except that the exposure was carried out using violet laser light beam (405 nm) instead of the FD-YAG laser beam.

Development

Each imagewise exposed plate was subjected to the standard treatment using an automatic developer (LP-850P2 available from Fuji Photo Film Co., Ltd.) to which a developer 1 (or 2) and a finishing gum liquid FP-2W (available from Fuji Photo Film Co., Ltd.). Pre-heating conditions used herein were as follows: temperature of the plate surface: 100° C.; developer temperature: 30° C.; and developer-dipping time: about 15 seconds.

The developers 1 and 2 had the following compositions, respectively, the pH values thereof as determined at 25° C. were found to be 11.5 (Developer 1) and 12.3 (Developer 2) and the electric conductivities were found to be 5 mS/cm (Developer 1) and 17 mS/cm (Developer 2).

| (Composition of Developer 1) | |
|---|---|
| Potassium hydroxide | 0.15 g |
| Polyoxyethylene phenyl ether (n = 13) | 5.0 g |
| CHEREST 400 (a chelating agent) | 0.1 g |
| Water | 94.75 g |
| (Composition of Developer 2) | |
| 1K-Potassium silicate | 2.5 g |
| Potassium hydroxide | 0.15 g |
| Polyoxyethylene phenyl ether (n = 13) | 5.0 g |
| CHEREST 400 (a chelating agent) | 0.1 g |
| Water | 92.25 g |

Evaluation of Lithographic Printing Plate

The resistance to staining (or contamination), resistance to staining upon allowing to stand, printing durability and ability of easily observing water uptake (plate-examination ability) of the lithographic printing plates thus obtained were evaluated according to the following methods.

(1) Resistance to Staining (Resistance to Contamination: "Res. to Contam.")

Each lithographic printing plate was attached to Mitsubishi DIA Type F2 Printing Press (Mitsubishi Heavy Industries, Ltd.) and the printing press was operated using DIC-GEOS (s) Red Ink and the degree of contamination of the blanket was visually evaluated after obtaining 10000 printed matters.

The results thus obtained are summarized in the following Tables 2 to 4. The resistance to staining (contamination) was evaluated according to 10-rank evaluation criteria depending on the degree of contamination of the blanket. In this respect, the larger the numerical value, the better the resistance to contamination.

(2) Resistance to Contamination Upon Allowing to Stand (Res. to Contam. Upon A.S.)

In the foregoing evaluation of the resistance to staining (or contamination), the printing plate was allowed to stand for one hour after preparing 10000 printed matters, thereafter the plate was again used in the printing operation and then the contamination of the blanket on the non-image area was visually evaluated.

The results thus obtained are summarized in the following Tables 2 to 4. The resistance to staining of the blanket upon allowing the plate to stand was evaluated according to the 4-rank evaluation criteria: ⊚, ○, Δ and X (the degree of contamination increased in this order).

(3) Printing Durability ("Prin. Dur.")

Each printing plate was fitted to LITHRON Printing Press available from Komori Corporation and the printing press was operated using DIC-GEOS (N) SUMI Ink to determine the number of printed matters at which it was visually recognized that the density of the solid image began to reduce. The printing durability was evaluated on the basis of the number of printed matters thus determined.

The results thus obtained are summarized in the following Tables 2 to 4.

(4) Plate-Examination Ability (P-Exam. Ab.")

Each lithographic printing plate prepared above was fitted to LITHRON Printing Press available from Komori Corporation, the degree of brilliancy of the non-image area on the plate surface was visually observed while increasing the amount of dampening water supplied thereto and the plate-examination ability (ability of easily observing water uptake) on the basis of the supplied amount of the dampening water observed when the non-image area began to be brilliant.

The results thus obtained are summarized in the following Tables 2 to 4. The plate-examination ability was evaluated according to the following 3-rank evaluation criteria: ○, Δ and X (the supplied amount of the dampening water increased in this order).

As will be clear from the results listed in the following Tables 2 to 4, the presensitized plate for making a lithographic printing plate of the present invention is excellent in both the resistance to contamination and the printing durability when a lithographic printing plate is prepared from the same, since the presensitized plate is prepared using the substrate for lithographic printing plates of the present invention (Examples 1 to 14) having, on the surface thereof, the grained pattern comprising superimposed medium waved structures having specific wavelengths and small waved structures having specific wavelengths. In particular, when the ratio of the depth to the pore size of a small waved pit is sufficiently high (Examples 1, 2 and 4 to 14), the resulting printing plate is quite excellent in the resistance to contamination.

Moreover, large waved structures having specific wavelengths are further superimposed on the foregoing surface grained pattern (Examples 9 to 14), the resulting lithographic printing plate is also excellent in the plate-examination ability and the resistance to contamination upon allowing to stand.

In contrast to this, when the average pore size of the small waved pit is too large (Comparative Examples 1, 2 and 5), the resulting printing plates are inferior in the resistance to contamination. Moreover, when the average pore size of the medium waved pit is too large (Comparative Example 3) and too small (Comparative Example 4), the resulting printing plates are inferior in the resistance to contamination and the printing durability. Further, when the average pore sizes of both small and medium waved pits are too large (Comparative Example 14), the resulting printing plate is inferior in the printing durability. In addition, when the substrate is free of any small waved structure on the surface (Comparative Examples 6, 7 and 11), the resulting printing plates are inferior in the resistance to contamination, while when it is free of any medium waved structure (Comparative Examples 8 to 13), the resulting printing plates are inferior in the printing durability.

Alternatively, when the light-sensitive layer used is free of any ethylenically unsaturated bond-containing compound having at least three methacryloyl or acryloyl groups alone or in any combination thereof in the molecule, the resulting printing plates are insufficient in the printing durability even when the light-sensitive layer is applied onto the substrate of the present invention having a characteristic surface grained pattern (Comparative Examples 15 to 17). More specifically, when the light-sensitive layer is free of any ethylenically unsaturated bond-containing compound having at least three such functional groups (Comparative Examples 15 and 16), the resulting printing plate has considerably low printing durability. Further, when using compounds whose ethylenically unsaturated groups are not methacryloyl or acryloyl groups (Comparative Example 17), the resulting printing plate also has considerably low printing durability.

TABLE 2

| | Surface Grained Pattern of Substrate (structures) | | | | Layer Structure | |
| | | | | | Light- | |
| Ex. No. | Large waved (WL) av (μm) | Medium waved (PD) av (μm) | (PD) av (μm) | (D/PD)av | sensitive No. | Intermediate layer No. |
|---|---|---|---|---|---|---|
| 1 | — | 1.4 | 0.14 | 0.46 | 1 | 1 |
| 2 | — | 1.4 | 0.16 | 0.22 | 7 | None |
| 3 | — | 1.4 | 0.15 | 0.16 | 3 | 2 |
| 4 | — | 1.4 | 0.07 | 0.22 | 4 | 4 |
| 5 | — | 1.4 | 0.03 | 0.3 | 5 | 3 |
| 15* | — | 1.4 | 0.18 | 0.22 | Comp. 8 | 2 |
| 1* | — | 1.4 | 0.25 | 0.2 | 1 | 1 |
| 2* | — | 1.4 | 0.25 | 0.12 | 4 | 4 |
| 6 | — | 3.5 | 0.14 | 0.46 | 6 | 4 |
| 7 | — | 1 | 0.14 | 0.46 | 2 | None |
| 3* | — | 5.6 | 0.14 | 0.46 | 6 | 4 |
| 4* | — | 0.4 | 0.14 | 0.46 | 2 | None |

| | Plate-making process | | | Evaluation of Lithographic printing Plate | | |
| | | | | | Prin. Dur. | |
| Ex. No. | Exposure Process No. | Developer No. | Res. to contam. | Res. to contam Upon A.S. | (No. of Printed matter × 10⁴) | P-Exam. Ability |
|---|---|---|---|---|---|---|
| 1 | 1 | 1 | 10 | ○ | 20 | Δ |
| 2 | 2 | 1 | 8 | ○ | 19 | Δ |
| 3 | 1 | 1 | 8 | ○ | 21 | Δ |
| 4 | 1 | 2 | 7 | ○ | 23 | Δ |
| 5 | 2 | 1 | 8 | ○ | 19 | Δ |
| 15* | 1 | 1 | 8 | ○ | 12 | Δ |
| 1* | 1 | 1 | 6 | ○ | 18 | Δ |
| 2* | 1 | 2 | 5 | ○ | 19 | Δ |
| 6 | 2 | 1 | 8 | ○ | 20 | Δ |
| 7 | 1 | 1 | 8 | ○ | 24 | Δ |
| 3* | 2 | 1 | 4 | ○ | 23 | Δ |
| 4* | 1 | 1 | 6 | ○ | 25 | Δ |

*: Comparative Example; (WL)av: average wavelength; (PD)av: average pore diameter; (D/PD)av: average ratio of the depth to the pore diameter of pits; "Res. to Contam.": resistance to contamination; "Res. to Contam. Upon A.S.": resistance to contamination upon allowing to stand; "Prin. Dur.": printing durability; "P-Exam. Ability": plate-examination ability.

TABLE 3

| Ex. No. | Surface Grained Pattern of Substrate (structures) | | | | Layer Structure | |
|---|---|---|---|---|---|---|
| | Large waved (WL)av (μm) | Medium waved (PD)av (μm) | (PD)av (μm) | (D/PD)av | Light sensitive layer No. | Intermediate layer No. |
| 8 | 65 | 1.4 | 0.14 | 0.46 | 1 | 1 |
| 9 | 65 | 1.4 | 0.07 | 0.22 | 2 | None |
| 16* | 65 | 1.4 | 0.18 | 0.22 | Comp. 9 | 4 |
| 5* | 65 | 1.4 | 0.25 | 0.12 | 2 | None |
| 10 | 65 | 3.5 | 0.14 | 0.46 | 3 | 2 |
| 11 | 37 | 3.5 | 0.14 | 0.46 | 4 | 4 |
| 12 | 14 | 1.4 | 0.14 | 0.46 | 5 | 3 |
| 13 | 100 | 3.5 | 0.14 | 0.46 | 6 | 4 |
| 14 | 79 | 35 | 0.14 | 0.46 | 7 | None |
| 17* | 65 | 1 | 0.14 | 0.46 | Comp. 10 | 3 |

| Ex. No. | Plate-making process | | | Evaluation of Lithographic printing Plate | | |
|---|---|---|---|---|---|---|
| | Exposure Process No. | Developer No. | Res. to contam. | Res. to contam. Upon A.S. | Prin. Dur. (No. of Printed matter × 10⁴) | P-Exam. Ability |
| 8 | 1 | 1 | 10 | ◎ | 19 | ○ |
| 9 | 1 | 1 | 7 | ○ | 22 | ○ |
| 16* | 1 | 2 | 8 | ○ | 13 | ○ |
| 5* | 1 | 1 | 5 | ○ | 20 | ○ |
| 10 | 1 | 1 | 8 | ○ | 18 | ○ |
| 11 | 1 | 2 | 8 | ◎ | 21 | ○ |
| 12 | 2 | 1 | 7 | ◎ | 18 | ○ |
| 13 | 2 | 1 | 8 | ◎ | 22 | Δ |
| 14 | 2 | 1 | 10 | ◎ | 18 | ○ |
| 17* | 2 | 1 | 8 | ○ | 9 | ○ |

*: Comparative Example; (WL)av: average wavelength; (PD)av: average pore diameter; (D/PD)av: average ratio of the depth to the pore diameter of pits; "Res. to Contain.": resistance to contamination; "Res. to Contam. Upon A.S.": resistance to contamination upon allowing to stand; "Prin.Dur.": printing durability; "P-Exam. Ability": plate-examination ability.

TABLE 4

| Ex. No. | Surface Grained Pattern of Substrate (structures) | | | | Layer Structure | |
|---|---|---|---|---|---|---|
| | Large waved (WL)av (μm) | Medium waved (PD)av (μm) | (PD)av (μm) | (D/PD)av | Light sensitive layer No. | Intermediate layer No. |
| 6* | 70 | 1.6 | — | — | 3 | 2 |
| 7* | — | 1.4 | — | — | 4 | 4 |
| 8* | 51 | — | 0.25 | 0.46 | 5 | 3 |
| 9* | 51 | — | 0.25 | 0.22 | 6 | 4 |
| 10* | 51 | — | 0.25 | 0.14 | 7 | None |
| 11* | 60 | — | — | — | 1 | 1 |
| 12* | — | — | 0.14 | 0.46 | 2 | None |
| 13* | 165 | — | 0.14 | 0.46 | 3 | 12 |
| 14* | — | 5.8 | 0.25 | 0.26 | 4 | 4 |

| Ex. No. | Plate-making process | | | Evaluation of Lithographic printing Plate | | |
|---|---|---|---|---|---|---|
| | Exposure Process No. | Developer No. | Res. to contam. | Res. to contam. Upon A.S. | Prin. Dur. (No. of Printed matter × 10⁴) | P-Exam Ability |
| 6* | 1 | 1 | 6 | 0 | 19 | ○ |
| 7* | 1 | 2 | 2 | ○ | 20 | Δ |
| 8* | 2 | 1 | 8 | ○ | 11 | ○ |
| 9* | 2 | 1 | 9 | ○ | 8 | ○ |
| 10* | 2 | 1 | 9 | ○ | 7 | ○ |

TABLE 4-continued

| | | | | | | |
|---|---|---|---|---|---|---|
| 11* | 1 | 1 | 2 | ○ | 13 | ○ |
| 12* | 1 | 1 | 10 | Δ | 2 | X |
| 13* | 1 | 1 | 6 | X | 18 | ○ |
| 14* | 1 | 2 | 9 | ○ | 14 | ○ |

*: Comparative Example; (WL)av: average wavelength; (PD)av: average pore diameter; (D/PD)av: average ratio of the depth to the pore diameter of pits;¢Res. to Contain.": resistance to contamination; "Res. to Contain. Upon A.S.": resistance to contamination upon allowing to stand; "Prin.Dur.": printing durability; "P-Exam. Ability": plate-examination ability.

As has been described above in detail, the present invention permits the preparation of a presensitized plate useful for making a lithographic printing plate capable of maintaining the balance between the resistance to contamination and the printing durability of the lithographic printing plate prepared from the presensitized plate to a substantially high level, when forming a light-sensitive layer containing a methacryl or acryl compound having at least three functional groups on the substrate according to the present invention having a characteristic surface grained pattern. In this connection, the resistance to contamination and the printing durability of a lithographic printing plate prepared from the conventional presensitized plate are in a trade-off relation and it has conventionally been quite difficult to maintain the balance therebetween at a sufficiently high level.

What is claimed is:

1. A presensitized plate useful for making a lithographic printing plate, which comprises an aluminum substrate provided thereon with a photopolymerizable light-sensitive layer, wherein the light-sensitive layer comprises an ethylenically unsaturated bond-containing compound having at least three methacryloyl or acryloyl groups alone or in any combination in the molecule and the substrate has on the surface, grained structures comprising large waved structure whose average wavelength ranges from 10 to 100 μm, medium waved structure whose average pore size ranges from 0.5 to 5 μm and small waved structure whose average pore size ranges from 0.01 to 0.2 μm, which are superimposed.

2. The presensitized plate useful for making a lithographic printing plate of claim 1, wherein the grained structure on the surface is formed by a method selected from the group consisting of:
  (a) a method comprising the step of subjecting an aluminum plate to a mechanical surface-roughening treatment, an alkali-etching treatment, a desmutting treatment with an acid and an electrochemical surface-roughening treatment using an electrolyte in this order;
  (b) a method comprising the step of subjecting an aluminum plate to a mechanical surface-roughening treatment, an alkali-etching treatment, a desmutting treatment with an acid and an electrochemical surface-roughening treatment repeated a plurality of times using different electrolytes;
  (c) a method comprising the step of subjecting an aluminum plate to an alkali-etching treatment, a desmutting treatment with an acid and an electrochemical surface-roughening treatment using an electrolyte in this order; and
  (d) a method comprising the step of subjecting an aluminum plate to an alkali-etching treatment, a desmutting treatment with an acid and an electrochemical surface-roughening treatment repeated a plurality of times using different electrolytes.

3. The presensitized plate useful for making a lithographic printing plate of claim 1, wherein the average ratio of the depth to the pore size of the small waved structure is not less than 0.2.

4. The presensitized plate useful for making a lithographic printing plate of claim 1, wherein the photopolymerizable light sensitive layer further comprises a photopolymerization initiator and a polymer binder.

5. The presensitized plate useful for making a lithographic printing plate of claim 1, wherein the ethylenically unsaturated bond-containing compound having at least three methacryloyl or acryloyl groups alone or in any combination is selected from the group consisting of trimethylolpropane triacrylate, trimethylolpropane tri(acryloyloxy-propyl)ether, trimethylolethane triacrylate, pentaerythritol triacrylate, pentaerythritol tetra-acrylate, dipentaerythritol penta-acrylate, dipentaerythritol hexa-acrylate, sorbitol triacrylate, sorbitol tetra-acrylate, sorbitol penta-acrylate, sorbitol hexa-acrylate, tri(acryloyloxy-ethyl)isocyanurate, trimethylolpropane tri-methacrylate, trimethylolethane tri-methacrylate, penta-erythritol tri-methacrylate, pentaerythritol tetra-methacrylate, dipentaerythritol hexa-methacrylate, dipentaerythritol penta-methacrylate, sorbitol tri-methacrylate, sorbitol tetra-methacrylate and diethylene-triamine tris-acrylamide.

6. The presensitized plate useful for making a lithographic printing plate of claim 1, wherein the light-sensitive layer further comprises an at most two functional group-containing (meth)acrylate compound having at most two methacryloyl groups or acryloyl groups alone or in any combination in the molecule.

7. The presensitized plate useful for making a lithographic printing plate of claim 6, wherein the ratio: (at least three functional group-containing (meth)acrylate compound)/(at most two functional group-containing (meth)acrylate compound) ranges from 4 to 0.25.

* * * * *